United States Patent
Sano et al.

(10) Patent No.: US 7,323,805 B2
(45) Date of Patent: Jan. 29, 2008

(54) PIEZOELECTRIC THIN FILM DEVICE AND METHOD FOR MANUFACTURING THE SAME

(75) Inventors: Kenya Sano, Kawasaki (JP); Ryoichi Ohara, Yokohama (JP); Naoko Yanase, Kawasaki (JP); Takaaki Yasumoto, Kawasaki (JP); Kazuhiko Itaya, Yokohama (JP); Takashi Kawakubo, Yokohama (JP); Hiroshi Toyoda, Kamakura (JP); Masahiko Hasunuma, Yokohama (JP); Toshihiko Nagano, Kawasaki (JP); Kazuhide Abe, Kawasaki (JP); Michihiko Nishigaki, Kawasaki (JP); Hironobu Shibata, Edogawa-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 244 days.

(21) Appl. No.: 11/043,257

(22) Filed: Jan. 27, 2005

(65) Prior Publication Data

US 2005/0184627 A1  Aug. 25, 2005

(30) Foreign Application Priority Data

| Jan. 28, 2004 | (JP) | ............................. 2004-020132 |
| Jan. 6, 2005 | (JP) | ............................. 2005-001346 |
| Jan. 14, 2005 | (JP) | ............................. 2005-007850 |

(51) Int. Cl.
*H01L 41/047* (2006.01)

(52) U.S. Cl. ...................... 310/358; 310/360; 310/361; 310/363; 310/364

(58) Field of Classification Search ........ 310/358–360, 310/363–365
See application file for complete search history.

(56) References Cited

U.S. PATENT DOCUMENTS

| 4,965,611 | A | * | 10/1990 | Pan et al. ...................... 347/64 |
| 5,187,561 | A | | 2/1993 | Hasunuma et al. |
| 6,054,770 | A | | 4/2000 | Toyoda et al. |
| 6,060,818 | A | * | 5/2000 | Ruby et al. ................. 310/363 |
| 6,350,017 | B1 | * | 2/2002 | Kamada ...................... 347/63 |
| 6,384,697 | B1 | * | 5/2002 | Ruby ......................... 333/189 |
| 2002/0008437 | A1 | * | 1/2002 | Inoue et al. ............. 310/313 A |
| 2004/0012463 | A1 | | 1/2004 | Kawakubo et al. |
| 2004/0125970 | A1 | | 7/2004 | Kawakubo |
| 2004/0172798 | A1 | * | 9/2004 | Ruby et al. ................ 29/25.35 |
| 2005/0184627 | A1 | | 8/2005 | Sano et al. |

FOREIGN PATENT DOCUMENTS

| JP | 2000-69594 | 3/2000 |
| JP | 2001-94373 | 4/2001 |
| JP | 2004-64785 | 2/2004 |
| JP | 2004-64786 | 2/2004 |

OTHER PUBLICATIONS

U.S. Appl. No. 11/447,999, filed Jun. 7, 2006, Ohara et al.

(Continued)

*Primary Examiner*—J. San Martin
(74) *Attorney, Agent, or Firm*—Oblon, Spivak, McClelland, Maier & Neustadt, P.C.

(57) ABSTRACT

A piezoelectric thin film device includes an amorphous metal film disposed on a substrate and a piezoelectric film disposed on the amorphous metal. One of crystal axis of the piezoelectric film is aligned in a direction perpendicular to a surface of the amorphous metal.

15 Claims, 31 Drawing Sheets

OTHER PUBLICATIONS

U.S. Appl. No. 11/043,257, filed Jan. 27, 2005, Sano et al.
U.S. Appl. No. 11/108,671, filed Apr. 19, 2005, Sano et al.
U.S. Appl. No. 11/039,872, filed Jan. 24, 2005, Kawakubo et al.
U.S. Appl. No. 10/890,989, filed Jul. 15, 2004, Ebuchi et al.
U.S. Appl. No. 08/112,210, filed Aug. 26, 1993, Toyoda.
U.S. Appl. No. 11/430,053, filed May 9, 2006, Motai et al.

Rajan S. Naik, et al., "Measurements of the Bulk, C-Axis Electromechanical Coupling Constant as a Function of AlN Film Quality", IEEE Transactions on Ultrasonics, Ferroelectrics, and Frequency Control, vol. 47, No. 1, Jan. 2000, pp. 292-296.
U.S. Appl. No. 11/671,206, filed Feb. 5, 2007, Ohara et al.
U.S. Appl. No. 11/675,811, filed Feb. 16, 2007, Sano et al.

* cited by examiner

FIG. 1

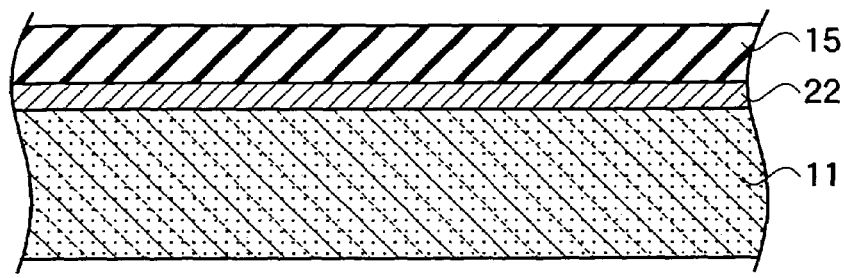

FIG. 2

|  | UNDER LYING LAYER | CRYSTAL STRUCTURE | PIEZOELECTRIC FILM QUALITY | FWHM |
|---|---|---|---|---|
| SAMPLE A | $Al_{0.4}Ta_{0.6}$ | AMORPHOUS METAL | C-AXIS ORIENTATION AlN | 2.3° |
| SAMPLE B | $Al_{0.4}Ta_{0.6}$ | AMORPHOUS METAL | C-AXIS ORIENTATION ZnO | 2.6° |
| SAMPLE C | $TiB_2$ | AMORPHOUS METAL | C-AXIS ORIENTATION AlN | 1.9° |
| SAMPLE D | $TiB_2$ | AMORPHOUS METAL | C-AXIS ORIENTATION ZnO | 1.8° |
| SAMPLE E | $SiO_2$ | AMORPHOUS INSULATOR | C-AXIS ORIENTATION AlN | 4.6° |
| SAMPLE F | $SiO_2$ | AMORPHOUS INSULATOR | C-AXIS ORIENTATION ZnO | 5.1° |
| SAMPLE G | $Al_2O_3$ | AMORPHOUS INSULATOR | C-AXIS ORIENTATION AlN | 4.1° |
| SAMPLE H | $Al_2O_3$ | AMORPHOUS INSULATOR | C-AXIS ORIENTATION ZnO | 4.2° |
| SAMPLE I | Al | POLYCRYSTAL METAL | POLYCRYSTAL AlN | – |
| SAMPLE J | Al | POLYCRYSTAL METAL | POLYCRYSTAL ZnO | – |
| SAMPLE K | poly-Si | POLYCRYSTAL SEMICONDUCTOR | POLYCRYSTAL AlN | – |
| SAMPLE L | poly-Si | POLYCRYSTAL SEMICONDUCTOR | POLYCRYSTAL ZnO | – |

FIG. 3

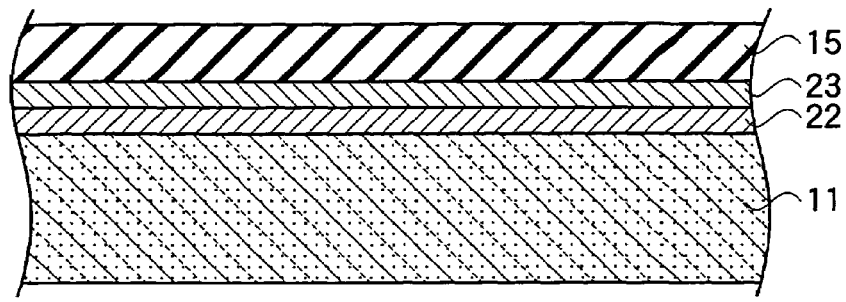

FIG. 4

| | UNDER LYING LAYER | CRYSTAL STRUCTURE | ORIENTATION METAL FILM QUALITY | FWHM | PIEZOELECTRIC FILM QUALITY | FWHM |
|---|---|---|---|---|---|---|
| SAMPLE M | $Al_{0.4}Ta_{0.6}$ | AMORPHOUS METAL | (111) ORIENTATION Al | 1.0° | C-AXIS ORIENTATION AlN | 1.5° |
| SAMPLE N | $TiB_2$ | AMORPHOUS METAL | (111) ORIENTATION Al | 1.6° | C-AXIS ORIENTATION AlN | 1.9° |
| SAMPLE O | $SiO_2$ | AMORPHOUS INSULATOR | (111) ORIENTATION Al | 4.2° | C-AXIS ORIENTATION AlN | 4.6° |
| SAMPLE P | $Al_2O_3$ | AMORPHOUS INSULATOR | (111) ORIENTATION Al | 4.0° | C-AXIS ORIENTATION AlN | 4.1° |
| SAMPLE Q | Al | POLYCRYSTAL METAL | POLYCRYSTAL Al | – | POLYCRYSTAL AlN | – |
| SAMPLE R | poly-Si | POLYCRYSTAL SEMICONDUCTOR | POLYCRYSTAL Al | – | POLYCRYSTAL AlN | – |

PIEZOELECTRIC THIN FILM DEVICE AND METHOD FOR MANUFACTURING THE SAME

CROSS REFERENCE TO RELATED APPLICATIONS AND INCORPORATION BY REFERENCE

This application is based upon and claims the benefit of priority from prior Japanese patent application P2004-020132 filed on Jan. 28, 2004, P2005-001346 filed on Jan. 6, 2005, and P2005-007850 filed on Jan. 14, 2005; the entire contents of which are incorporated by reference herein.

BACKGROUND OF THE INVENTION

1. Field of the Invention

The present invention relates to piezoelectric thin film devices used in piezoelectric devices, and particularly to piezoelectric thin film devices used in high frequency bands, and a manufacturing method for the same.

2. Description of the Related Art

Recently, high frequency bands in the GHz range are being used in wireless communication systems such as mobile communication devices, and local area network (LAN) systems transferring data between computers at high transfer rates. Piezoelectric thin film devices are receiving attention in applications such as high frequency (RF) devices of high frequency electronics of such wireless communications systems. Applications as devices such as resonators, variable capacitors, and micro switches, for example, are expected uses for piezoelectric thin film devices. Piezoelectric thin film devices according to micro electro mechanical system (MEMS) technology are manufactured using thin film micro fabrication processes in the same manner as for semiconductor devices such as metal insulated semiconductor (MIS) integrated circuits. Therefore, it is possible to integrate MEMS piezoelectric thin film devices and semiconductor devices on a common semiconductor substrate.

Surface acoustic wave (SAW) devices, for example, are generally used as high frequency resonators. However, the resonant frequency of SAW devices exhibits an inversely proportional relationship to the gap distance between comb type electrodes. Since, at a frequency range exceeding 1 GHz, the gap distance between comb type electrodes of SAW devices is 1 m or less, it is difficult to correspond to recent higher usage frequencies demands.

In place of SAW devices, a film bulk acoustic wave resonator (FBAR), which makes use of a mode of longitudinal vibration in the thickness direction of a piezoelectric film, has recently been receiving attention as a resonator. The FBAR, which uses a piezoelectric film, is also occasionally referred to as a bulk acoustic wave (BAW) device. In the FBAR, resonant frequency is regulated by the acoustic velocity and film thickness of the piezoelectric device. For example, the piezoelectric film corresponds to an average film thickness of about 1 µm to about 2 µm at a band of 2 GHz, or a film thickness of about 0.4 µm to about 0.8 µm at a band of 5 GHz. By thinning the piezoelectric film further, it is possible to increase frequency by several tens of GHz.

In the structure of a current representative FBAR, a piezoelectric film of a material such as aluminum nitride (AlN) or zinc oxide (ZnO) is sandwiched between two opposing electrodes, more specifically, a top electrode and a bottom electrode. For improved performance, a resonator of the FBAR type is disposed so as to be suspended above a cavity. A fabrication method for an FBAR having a cavity is disclosed (refer to Japanese published unexamined application No. 2000-69594). For example, a hollow portion can be formed by anisotropic etching on a silicon (Si) substrate. Next, a sacrificial layer of an easily etched material, such as boron and phosphorous doped silicon glass (BPSG), for example, is filled into the hollow portion and planarized. A bottom electrode, a piezoelectric film, and a top electrode, respectively, are then stacked in sequence on top of the planarized sacrificial layer. Afterward, a hole is bored from the top electrode, which is formed above the sacrificial layer, to extend to the sacrificial layer. The sacrificial layer is removed by selective etching, forming the cavity.

Piezoelectric characteristics of a piezoelectric film used in FBARs are dependant upon orientation. In AlN piezoelectric films, for example, there is a strong mutual relationship between a full width at half maximum (FWHM) of c-axis orientation of an AlN crystal and an electromechanical coupling constant (refer to Rajan S. Naik et al., "Measurements of Bulk, C-Axis Electromechanical Coupling Constant as a Function on AlN Film Quality", IEEE transactions on ultrasonics, ferroelectrics, and frequency control, Vol. 47, No. 1, pp. 292-296, January 2000). In order to attain desired piezoelectric qualities, it is essential to form a piezoelectric film so that the c-axis direction is oriented along the direction in which the bottom electrode and the top electrode oppose each other. However, there are limits on the orientation of the AlN piezoelectric film formed on top of the sacrificial layer, which raises the problem of a small electromechanical coupling constant.

In order to improve the orientation of piezoelectric crystal, there is a manufacturing method of an FBAR by epitaxially growing a piezoelectric film on a substrate (refer to Japanese published unexamined patent application No. 2001-94373). In the method disclosed in Japanese published unexamined patent application No. 2001-94373, an AlN piezoelectric film is epitaxially grown in (0001) orientation, more specifically, in the c-axis direction, on an Si substrate of (111) orientation. A top electrode is formed on top of the AlN piezoelectric film. Afterward, the Si substrate is removed by anisotropic etching from the underside of the substrate until the AlN piezoelectric film is exposed, forming a via hole. After the AlN piezoelectric film has been exposed, the bottom electrode is formed from the underside of the substrate. Thus, a resonator using the epitaxial AlN piezoelectric film is formed above the cavity.

In the above mentioned manufacturing method, in order to orient the AlN piezoelectric film along the c-axis, it is essential to use a Si substrate in the (111) orientation. It may be a problem to use the (111) orientated substrate, which is different from the (100) orientated substrate used in general manufacturing methods of semiconductor devices.

Additionally, piezoelectric thin film devices such as variable capacitors or micro switches, have a movable electrode provided on an actuator, and a fixed electrode provided on a surface of a substrate which opposes the actuator. The actuator is supported on one end so as to be suspended over a substrate. The actuator changes the distance between the movable electrode and the fixed electrode. Piezoelectric actuators using an electrostriction effect or a reverse piezoelectric effect of a piezoelectric film, as a driving force, are currently being tested.

Lead zirconate-titanate (PZT) is a material known as a piezoelectric film having a large electrostriction effect. On PZT, in order to attain a film of good quality, it is essential to execute annealing at a temperature of about 600° C. after forming the film at room temperature. Because volume contraction occurs due to the annealing, the residual distortion of the PZT film will inevitably increase. The piezoelectric actuator is suspended in the air, and has a long and thin beam structure, which contains a piezoelectric layer sandwiched by the top and bottom electrodes. Therefore, it is difficult to suppress warpage occurring on the PZT piezoelectric film by residual distortion. Because a piezoelectric film of materials such as AlN, or ZnO can be deposited at near room temperature, it is possible to precisely control residual stress by film deposition conditions, compared to the PZT piezoelectric film. However, the electrostriction effect of materials such as AlN, or ZnO is small compared with PZT. Therefore, it is possible to have a small electromechanical coupling constant of the piezoelectric film, which may not be sufficient to ensure a sufficient drive range of the piezoelectric actuator.

SUMMARY OF THE INVENTION

It is an object of the present invention to provide a piezoelectric thin film device having an electromechanical coupling constant that can be improved, as well as a manufacturing method for the same.

A first aspect of the present invention inheres in a piezoelectric thin film device including an amorphous metal film disposed above a substrate; and a piezoelectric film disposed on the amorphous metal, and one of crystal axis of the piezoelectric film being aligned in a direction perpendicular to a surface of the amorphous metal.

A second aspect of the present invention inheres in a method for manufacturing a piezoelectric thin film device, including forming an amorphous metal film above a substrate; forming a piezoelectric film on the amorphous metal, so that one of crystal axis of the piezoelectric film is aligned in a direction perpendicular to a surface of the amorphous metal; and forming a top metal film on a surface of the piezoelectric film, the top metal film facing the amorphous metal film so as to sandwich the piezoelectric film.

BRIEF DESCRIPTION OF DRAWINGS

FIG. 1 is a cross section view showing an example of a piezoelectric film according to embodiments of the present invention.

FIG. 2 is a table showing an example of evaluation of the orientation of the piezoelectric film according to the embodiments of the present invention.

FIG. 3 is a cross section view showing another example of the piezoelectric film according to the embodiments of the present invention.

FIG. 4 is a table showing another example of evaluation of the orientation of the piezoelectric film according to the embodiments of the present invention.

DETAILED DESCRIPTION OF THE INVENTION

Figure 5:
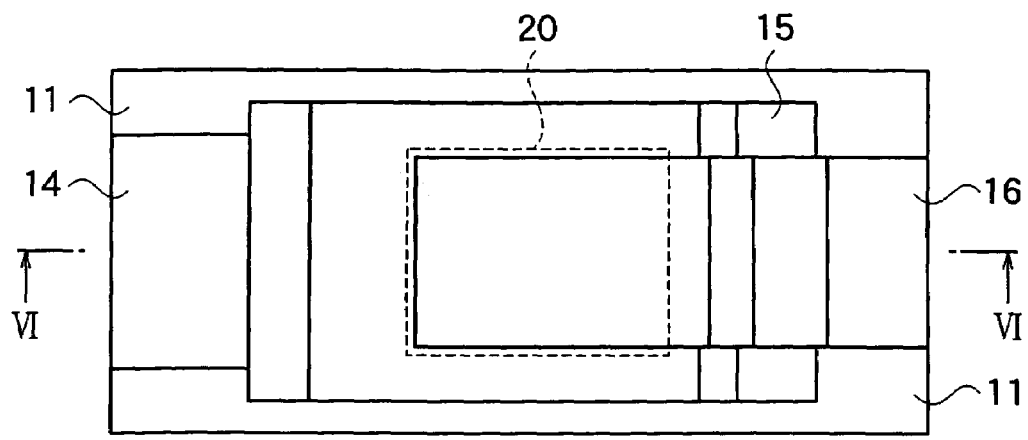
FIG. 5 is a plan view showing an example of an FBAR according to a first embodiment of the present invention.

Various embodiments of the present invention will be described with reference to the accompanying drawings. It is to be noted that the same or similar reference numerals are applied to the same or similar parts and devices throughout the drawings, and the description of the same or similar parts and devices will be omitted or simplified.

As shown in FIG. 1, a piezoelectric film 15 used in a piezoelectric thin film device according to the first and second embodiments of the present invention is provided on a surface of an amorphous metal film 22, which is an underlying layer provided on top of a substrate 11. A semiconductor substrate such as Si is used as the substrate 11. A metal such as aluminum tantalum ($Al_xTa_{1-x}$) or titanium diboride ($TiB_2$) is used as the amorphous metal film 22. It has been confirmed by X-ray diffraction (XRD) reflection high energy electron diffraction (RHEED), and the like, that $Al_xTa_{1-x}$ alloy having an Al mole fraction x in a range from about 0.1 to about 0.9 deposited by sputtering at near room temperature is amorphisized.

The performance of the piezoelectric film 15 can be expressed by the electromechanical coupling constant $Kt^2$, which indicates the magnitude of the piezoelectric effect, and the quality factor Q, which is an indicator of the sharpness of mechanical oscillation in a resonant frequency. For improving the electromechanical coupling constant of the piezoelectric film 15, it is important to align a polarization axis of a piezoelectric crystal in the thickness direction of the piezoelectric film 15. Also, by aligning the crystal orientation of the piezoelectric film 15 in the polarization direction using a high purity piezoelectric crystal, a large quality factor Q can be attained.

For example, in an RF filter or a voltage controlled oscillator (VCO) using FBARs, bandwidth can be increased as much as the electromechanical coupling constant is large. The quality factor Q relates to an insertion loss of the RF filter, and a degree of oscillation purity of the VCO. There are various phenomenon of elastic wave absorption relating to the quality factor Q. Additionally, in piezoelectric actuators, because the drive range increases as much as the electromechanical coupling constant of the piezoelectric film is large, it is possible to achieve a low drive voltage and a large variable range for an actuator.

A piezoelectric crystal of a material such as AlN or ZnO used as the piezo electric film 15 is hexagonal. A hexagonal crystal has an inherent crystal habit to easily align in the c-axis orientation. It is possible to align a polarization axis by orienting the piezoelectric film 15 singularly in the c-axis, more specifically, the (0001) direction, which is the polarization direction of the piezoelectric crystal. As a result, it is possible to ensure the electromechanical coupling constant and quality factor Q of the piezoelectric film.

AlN and ZnO piezoelectric films are formed on top of various underlying layers, and orientations of the piezoelectric films are evaluated using a technique such as XRD. All of the underlying layers and the piezoelectric films are deposited at room temperature by magnetron sputtering. Thickness of each piezoelectric film is about 500 nm. As shown in FIG. 2, in samples A and B, which use an $Al_{0.4}Ta_{0.6}$ amorphous metal film as an underlying layer, the AlN and ZnO piezoelectric films are highly oriented in the c-axis direction which is perpendicular to a surface of the underlying layer, with a full width at half maximum (FWHM) of 2.3° and 2.6° respectively. In samples C and D, which use a $TiB_2$ amorphous metal film as an underlying layer, AlN and ZnO piezoelectric films are highly oriented in the c-axis orientation with a FWHM of 1.9° and 1.8° respectively.

Additionally, in samples E to H, which use amorphous insulating layers of material such as silicon oxide ($SiO_2$) and aluminum oxide ($Al_2O_3$) for underlying layers, AlN and ZnO piezoelectric films are oriented in the c-axis orientation. The FWHM of the orientation for each of the samples E to H is in a range from about 4.10 to about 5.10, which is broader, and orientation is inferior compared to the samples A to D. Further, in samples I to L, which use Al polycrystal metal and polycrystal Si semiconductor (poly-Si) for underlying layers, AlN and ZnO piezoelectric films are not singularly oriented but become a polycrystal film with a little or no orientation. Thus, the effects of the amorphous metal under layers on increasing orientation characteristics of piezoelectric film are extremely large.

A surface of polycrystal metal is formed by crystal grains having many orientations respectively, and there are many cases of surface irregularities depending on crystal grains. Correspondingly, an amorphous metal is formed with a uniformly amorphous surface. Root mean square roughness detected by techniques such as surface roughness measurement and atomic force microscopes (AFM) is, for example, 3 nm and above in a case of polycrystal metal surfaces, and 3 nm and below in a case of amorphous surfaces. Thus, because an extremely flat and uniform surface is attained with an amorphous metal, a hexagonal crystal such as AlN and ZnO can be grown with orientation in the c-face [0001], which is an inherent face of the hexagonal crystal formed by crystal habit. As a result, it is possible to improve orientation of AlN or ZnO piezoelectric film formed on top of an amorphous metal film.

Additionally, when compared with amorphous insulating layers of $SiO_2$ and the like, which are normally used as an underlying layer or a sacrificial layer on a surface of a substrate, the surface energy of an amorphous metal is generally higher than the amorphous insulation layers. By nature, a crystal provided on an amorphous metal film tends to grow in a layer so as to decrease the surface energy. Therefore, orientation of the piezoelectric film may be further improved on the amorphous metal film.

Additionally, as shown in FIG. 3, a piezoelectric layer 15 is deposited on an orientation metal film 23 provided on a surface of an amorphous metal film 22 as an underlying layer. One of crystal axis of the orientation metal film 23 may be aligned in a direction perpendicular to the surface of the amorphous metal 22. The orientation metal film 23 is grown highly oriented on top of the surface of the amorphous metal film 22. As the orientation metal film 23, it is possible to use a face-centered cubic lattice (fcc) metal such as Al, copper (Cu), gold (Au), silver (Ag), iridium (Ir), nickel (Ni), or platinum (Pt), which can be strongly aligned in the (111) orientation by crystal habit, and a body-centered cubic lattice (bcc) metal such as molybdenum (Mo) or tungsten (W), which can be strongly aligned in the (110) orientation by crystal habit. It is possible to form a highly oriented piezoelectric film of AlN (0001), or ZnO (0001)

which may be deposited onto the orientation metal film 23 of the highly oriented Al (111), Cu (111), Au (111), Ag (111), Ir (111), Ni (111), Pt (111), Mo (110), W (110) or the like, to inherit the orientation of the orientation metal film 23.

Al metal films and AlN piezoelectric films are formed on top of various underlying layers, and orientations of the piezoelectric films are evaluated using a technique such as XRD. The underlying layers, the metal films, and the piezoelectric films are all deposited at room temperature by magnetron sputtering. Thickness of each piezoelectric film is about 500 nm. As shown in FIG. 4, in sample M, which uses an $Al_{0.4}TA_{0.6}$ amorphous metal film as an underlying layer, an Al metal film and an AlN piezoelectric film are highly oriented in the (111) orientation and the c-axis direction with an FWHM of 1.0° and 1.5° respectively. Additionally, in sample N, which uses a $TiB_2$ amorphous metal film as an underlying layer, an Al metal film and an AlN piezoelectric film are highly oriented in the (111) orientation and the c-axis direction with an FWHM of 1.6 and 1.9 respectively.

Additionally, in samples O and P, which use amorphous insulating layers of material such as $SiO_2$ and $Al_2O_3$ for underlying layers, Al metal films are oriented in the (111) orientation with FWHM of 4.2° and 4.0°, respectively, and AlN piezoelectric films are oriented in the c-axis direction with an FWHM of 4.6° and 4.1°, respectively. The FWHM of the orientation for each of the Al metal films and AlN piezoelectric films of the samples O and P is inferior compared to the samples M and N. Further, in samples Q to R, which use an Al polycrystal metal or a poly-Si for an underlying layer, an Al metal film and an AlN piezoelectric film are not oriented but become a polycrystal film with singularly little or no orientation.

Thus, by providing the orientation metal film 23 between the amorphous metal film 22 and the piezoelectric film 15, it is possible to further highly orient the piezoelectric film.

First Embodiment

An FBAR as a piezoelectric thin film device according to a first embodiment of the present invention includes a bottom electrode 14 of an amorphous metal film provided on a surface of a substrate 11, a piezoelectric film 15 provided on a surface of the bottom electrode 14, and a top electrode (top metal film) 16 provided on top of a surface of the piezoelectric film 15, as shown in FIG. 5. A resonator 20 is defined as a region in which the bottom electrode 14 and the top electrode 16 are facing each other, including the piezoelectric film 15 sandwiched by the facing bottom electrode 14 and top electrode 16.

Figure 6:
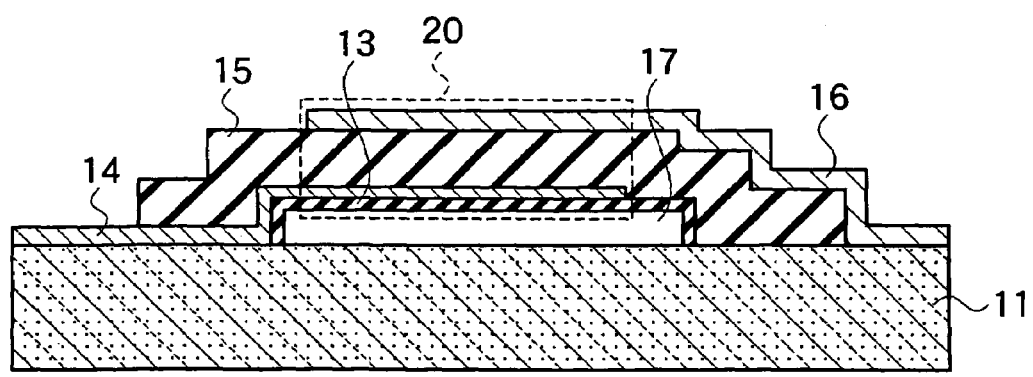
FIG. 6 is a cross section view taken on line XI-XI of the FBAR shown in FIG. 5.

Additionally, as shown in FIG. 6, a barrier layer 13 is provided surrounding a cavity 17 provided on top of the substrate 11. The resonator 20 is disposed on top of the cavity 17 so as to be projecting into a free space. The bottom electrode 14 is provided from the surface of the substrate 11 extending to the surface of the barrier layer 13. For example, the substrate 11 is a Si semiconductor substrate with high resistance of above about 1000 Ω-cm. The barrier layer 13 is an $SiO_2$ film. The bottom electrode 14 is an AlTa amorphous metal film. The piezoelectric film 15 is AlN. The top electrode 16 is an Al metal film.

In the piezoelectric film 15 of the resonator 20, a high frequency signal is transmitted by the vibration of the bulk acoustic waves excited by the high frequency signal applied to the bottom or top electrodes 14, 16. For example, a GHz range high frequency signal applied from the bottom electrode 14 is transmitted to the top electrode 16 through the piezoelectric film 15. On the amorphous bottom electrode 14, the piezoelectric film 15 is highly oriented in the c-axis direction, which is the polarization direction of the piezoelectric crystal. Consequently, it is possible to ensure a large electromechanical coupling constant and a high quality factor Q of the piezoelectric film 15.

According to the first embodiment, it is possible to highly orient the piezoelectric film 15 in the c-axis direction, and to improve the electromechanical coupling constant and the quality factor Q. As a result, it is possible to achieve desirable resonant characteristics of the resonator 20 of the FBAR.

Next, a manufacturing method of the FBAR according to the first embodiment will be described with reference to the cross section views shown in FIGS. 7 to 10. Each cross section view used in the description corresponds to the cross section from the IV-IV line shown in FIG. 5.

Figure 7:
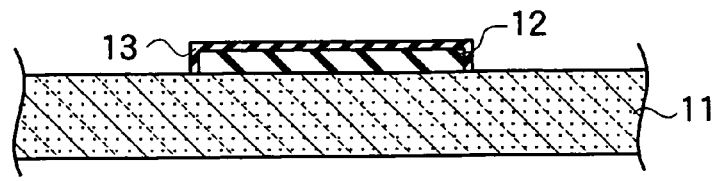
FIGS. 7 to 10 are cross section views showing an example of a manufacturing method of the FBAR according to the first embodiment of the present invention.

A strontium lutetium oxide ($SrRuO_3$) layer is formed at a thickness of about 1 μm on a surface of a Si substrate 11 by RF magnetron sputtering and the like. As shown in FIG. 7, the $SrRuO_3$ layer is then removed by photolithography, wet etching and the like, to form a sacrificial layer 12. Subsequently, an $SiO_2$ layer is deposited at a thickness of about 50 nm on the surface of the substrate 11 where the sacrificial layer 12 is formed, by RF magnetron sputtering and the like. By photolithography, wet etching and the like, the $SiO_2$ layer is selectively removed to form a barrier layer 13.

Figure 8:
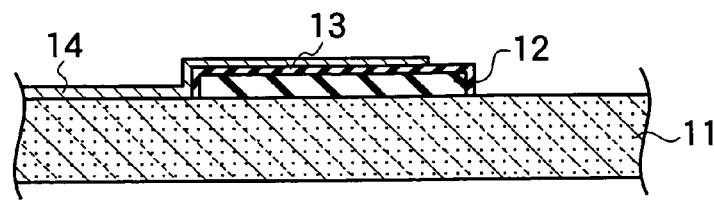

An amorphous metal layer of $Al_{0.4}Ta_{0.6}$ or the like is deposited on top of the substrate 11 by RF magnetron sputtering and the like. As shown in FIG. 8, by photolithography, reactive ion etching (RIE) using a fluoride based gas, the amorphous metal layer is selectively removed to form a bottom electrode 14.

Figure 9:
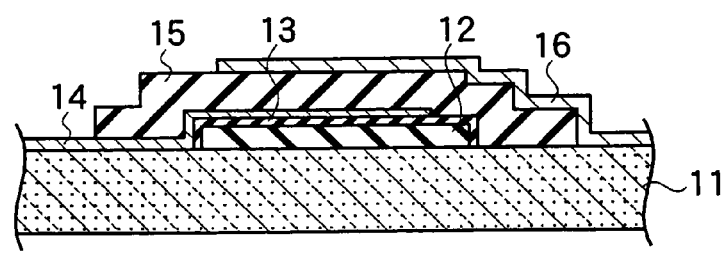

A piezoelectric layer of AlN and the like is deposited at a thickness of about 1.4 μm on the substrate 11 by reactive RF magnetron sputtering and the like. As shown in FIG. 9, by photolithography, RIE using a chloride based gas, the piezoelectric layer is selectively removed to form a piezoelectric film 15 which covers an end of the bottom electrode 14. Afterward, a metal layer of Al and the like is deposited on top of the substrate 11 by RF magnetron sputtering and the like. By photolithography, RIE and the like, the metal layer is selectively removed to form a top electrode 16 extending to a side of the end of the bottom electrode 14 that was covered by the piezoelectric film 15.

Figure 10:
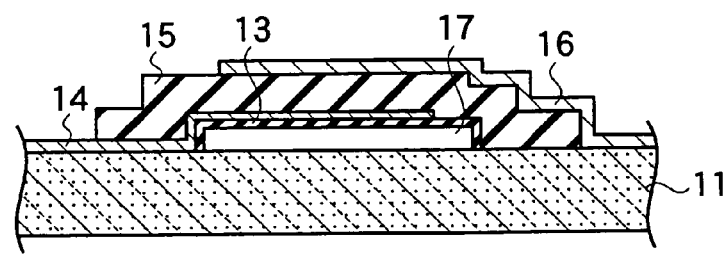

As shown in FIG. 10, by etching using a 3% concentration of cerium ammonium nitrate ($Ce((NH_4)_2(NO_3)_6)$), the sacrificial layer 12 is selectively removed from a portion where the sacrificial layer 12 is exposed on top of the substrate 11 (not illustrated), to form a cavity 17. Thus, a resonator 20 having the bottom electrode 14, the piezoelectric film 15, and the top electrode 16 on top of the cavity 17 is formed, as shown in FIG. 6.

In the manufacturing method of the FBAR according to the first embodiment, the amorphous metal film is used as the bottom electrode 14. The piezoelectric film 15 is deposited on the surface of the bottom electrode 14, in an area corresponding to the resonator 20. As a result, the piezoelectric film 15 in the area of the resonator 20 is highly oriented in the c-axis direction, which is the polarization direction.

Frequency characteristics of the manufactured FBAR are measured using a network analyzer and the like. For example, a resonant frequency of the FBAR according to the first embodiment is about 2.1 GHz. Additionally, an electromechanical coupling constant and a quality factor Q of the piezoelectric film 15 are evaluated from the resonance characteristics of the FBAR. For example, the electromechanical coupling constant is about 6.4%. The quality factor Q is about 700 at a resonance point, and about 620 at an antiresonance point. The electromechanical coupling constant and the quality factor Q are roughly the same compared to an FBAR using an epitaxially grown single crystal piezoelectric film. Thus, the piezoelectric film 15 of the FBAR according to the first embodiment may provide desirable piezoelectric characteristics.

According to the first embodiment, it is possible to highly orient the piezoelectric film 15 in the c-axis direction without using an expensive and complicated growth technology such as epitaxial growth. Thus, it is possible to achieve an FBAR in which the electromechanical coupling constant and quality factor Q are improved.

First Modification of the First Embodiment

Figure 11:
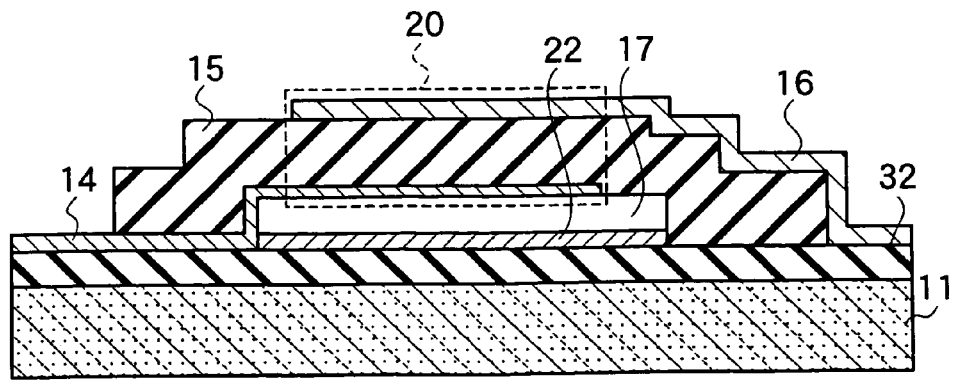
FIG. 11 is a cross section view showing an example of an FBAR according to a first modification of the first embodiment of the present invention.

An FBAR according to a first modification of the first embodiment of the present invention includes a bottom electrode 14 provided on an insulating film 32 on a surface of a substrate 11, a piezoelectric film 15 provided on top of a surface of the bottom electrode 14, and a top electrode 16 provided on top of a surface of the piezoelectric film 15, as shown in FIG. 11. A resonator 20 is disposed on a cavity 17 between an amorphous metal film 22 provided on the surface of the insulating film 32 and the bottom electrode 14. The insulating film 32 is an $SiO_2$ film, a silicon nitride ($Si_3N_4$) film, or a composite film of an $SiO_2$ film and an $Si_3N_4$ film. The bottom electrode 14 is an oriented metal film such as Mo. The amorphous metal film 22 is AlTa. The top electrode 16 is a metal film such as Mo.

The first modification of the first embodiment differs from the first embodiment in that the amorphous metal film 22 is provided so as to surround the cavity 17 and faces the bottom electrode 14. Other configurations are as in the first embodiment, so duplicated descriptions are omitted.

A metal such as Al, which is capable of being selectively removed with respect to a metal material used for the bottom electrode 14, is formed on the amorphous metal film 22. On the amorphous metal film 22, the Al metal film can be highly aligned in the (111) orientation in a direction vertical to the surface of the amorphous metal film 22. Mo, used for the bottom electrode 14, may highly align in the (110) orientation on the Al metal film of the (111) orientation. On the bottom electrode 14 that is highly (110) oriented, the piezoelectric film 15 may highly align with the c-axis direction, which is the polarization direction of a piezoelectric crystal. Therefore, it is possible to ensure a large electromechanical coupling constant and a high quality factor Q of the piezoelectric film 15.

A manufacturing method of an FBAR according to the first modification of the first embodiment will be described referring to the cross section views as shown in FIGS. 12 to 16.

Figure 12:
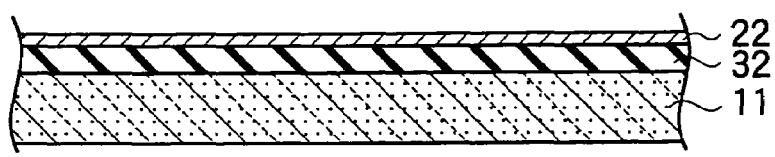
FIGS. 12 to 16 are cross section views showing an example of a manufacturing method of the FBAR according to the first modification of the first embodiment of the present invention.

As shown in FIG. 12, an insulating film 32 such as $SiO_2$ is formed on a surface of a substrate 11 at a thickness of about 1 μm by thermal oxidation or the like. An amorphous metal film 22 of $Al_{0.4}Ta_{0.6}$, or the like is deposited at a thickness of about 0.2 μm on a surface of the insulating film 32 by RF magnetron sputtering and the like.

Figure 13:
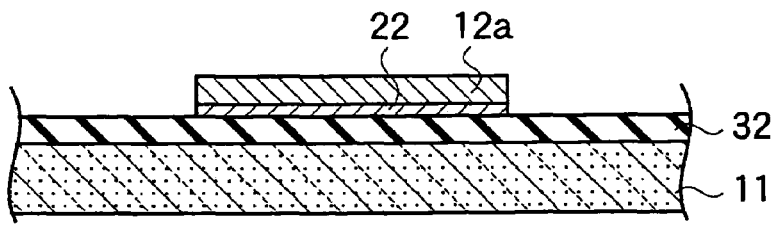

A metal layer of Al or the like, having a thickness of about 0.1 μm, is deposited by RF magnetron sputtering and the like. The Al metal layer is selectively removed by photolithography, RIE using a chloride based gas, and the like, as shown in FIG. 13, to form a sacrificial layer 12a.

Figure 14:
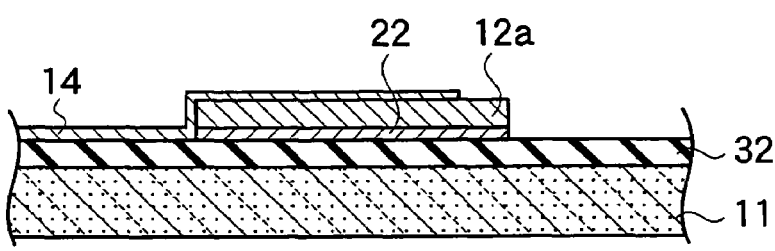

A metal layer such as Mo is deposited by RF magnetron sputtering and the like. As shown in FIG. 14, by photolithography, RIE using a chloride based gas, and the like, the Mo metal layer is selectively removed to form a bottom electrode 14.

Figure 15:
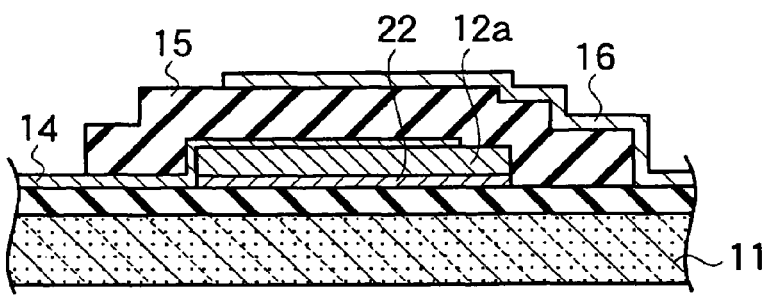

A piezoelectric layer such as AlN is deposited at a thickness of about 1.4 μm by RF magnetron sputtering and the like. As shown in FIG. 15, by photolithography, RIE using a chloride based gas, and the like, the AlN piezoelectric layer is selectively removed to form a piezoelectric film 15. Furthermore, a metal layer such as Mo is deposited on the piezoelectric film 15 by RF magnetron sputtering and the like. The Mo metal layer is selectively removed by photolithography, RIE and the like to form the top electrode 16.

Figure 16:
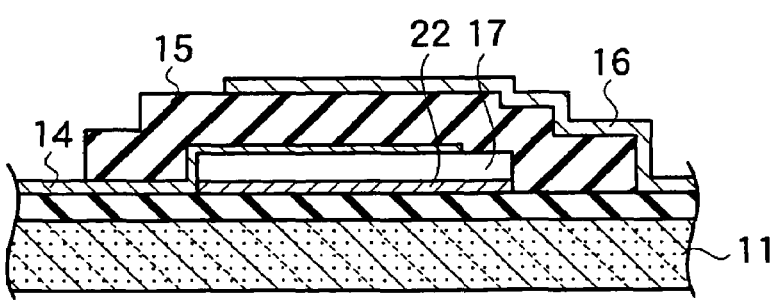

As shown in FIG. 16, by wet etching using a 10% concentration of hydrochloric acid and the like, the Al sacrificial layer 12a is selectively removed where the sacrificial layer 12a is exposed above the surface of the substrate 11 (not illustrated), to form a cavity 17. Thus, a resonator 20 having the bottom electrode 14, the piezoelectric film 15, and the top electrode 16, is formed on top of the cavity 17, as shown in FIG. 11.

In the first modification of the first embodiment, since the sacrificial layer 12a on the amorphous metal layer 22 is highly oriented, a highly oriented piezoelectric film 15 can be formed even around the resonator 20. As a result, it is possible to highly orient the piezoelectric film 15 in the c-axis direction in the entire region over the cavity 17, and to increase the mechanical strength of the piezoelectric film 15.

Frequency characteristics of the manufactured FBAR are measured using a network analyzer and the like. For example, a resonant frequency of the FBAR is about 2.1 GHz. Additionally, an electromechanical coupling constant and a quality factor Q of the piezoelectric film 15 are evaluated from the resonance characteristics of the FBAR. For example, the electromechanical coupling constant is about 6.5%. The quality factor Q is about 800 at a resonance point, and about 750 at an antiresonance point. The electromechanical coupling constant and the quality factor Q increase. Thus, the piezoelectric film 15 of the FBAR according to the first modification of the first embodiment may provide desirable piezoelectric characteristics.

According to the first modification of the first embodiment, it is possible to highly orient the piezoelectric film 15 in the c-axis direction without using an expensive and complicated growth technology such as epitaxial growth. Thus, it is possible to achieve an FBAR in which the electromechanical coupling constant and quality factor Q are improved.

Second Modification of the First Embodiment

Figure 17:
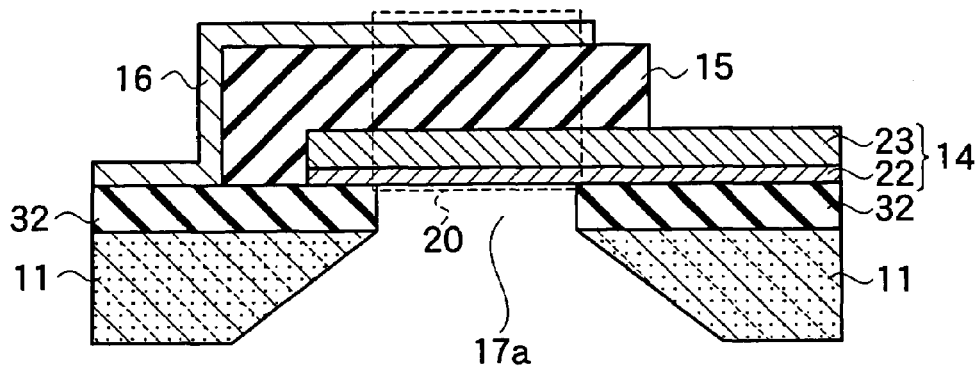
FIG. 17 is a cross section view showing an example of an FBAR according to a second modification of the first embodiment of the present invention.

An FBAR according to a second modification of the first embodiment of the present invention includes a bottom electrode 14 having an amorphous metal film 22 provided on a surface of an insulating film 32 and an orientation metal film 23 provided on a surface of the amorphous metal film 22, as shown in FIG. 17. The bottom electrode 14, a piezoelectric film 15 and a top electrode 16 are supported by the substrate 11 and the insulating film 32, both including a cavity 17a. A resonator 20 is defined by the bottom electrode 14, the piezoelectric film 15 and the top electrode 16, which are provided on the cavity 17a. The cavity 17a has an inclined side wall in such a way that the cavity becomes narrow in a direction toward the insulating film 32 from the bottom surface of the substrate 11.

The amorphous metal film 22 of the bottom electrode 14 is, for example, AlTa. The orientation metal film 23 is Al or the like, which is oriented in the (111) orientation perpendicular to the surface of the amorphous metal film 22.

The second modification of the first embodiment is different from the first modification of the first embodiment in that the bottom electrode 14 including the amorphous metal film 22 and the orientation metal film 23 is placed on the cavity 17a provided in the substrate 11 and the insulating film 32. Other configurations are as in the first embodiment and the first modification of the first embodiment, so duplicated descriptions are omitted.

In the second modification of the first embodiment, the orientation metal film 23 such as Al, which is oriented in the (111) orientation direction, is provided on the amorphous metal film 22 of the bottom electrode 14. The piezoelectric film 15 formed on the oriented orientation metal film 23 can be strongly aligned in the c-axis direction. Therefore, it is possible to ensure a large electromechanical coupling constant and a high quality factor Q of the piezoelectric film 15. In addition, since the bottom electrode 14 extends to a location on the insulating film 32 over the entire area of the cavity 17a, the mechanical strength of the piezoelectric film 15 may structurally increase. Additionally, above the cavity 17a, the piezoelectric film 15 is evenly formed away from a step of an end portion of the bottom electrode 14. Therefore, it is possible to prevent deterioration of orientation of the piezoelectric film 15 in vicinity of the resonator 20, and to prevent the generation of spurious vibrations in the resonance characteristics of the FBAR.

Next, a manufacturing method of an FBAR according to the second modification of the first embodiment will be described with reference to the cross section views as shown in FIGS. 18 to 21.

Figure 18:
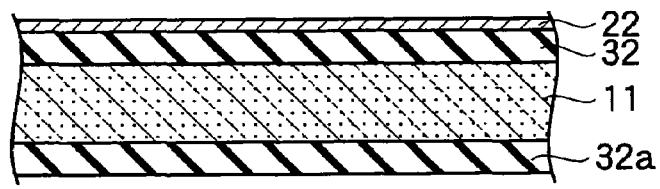
FIGS. 18 to 21 are cross section views showing an example of a manufacturing method of the FBAR according to the second modification of the first embodiment of the present invention.

An insulating film 32, 32a such as $SiO_2$ is formed on top and back surfaces of a substrate 11 at a thickness of about 1 μm by thermal oxidation or the like, as shown in FIG. 18. An amorphous metal film 22 such as $Al_{0.4}Ta_{0.6}$ is deposited at a thickness of about 0.2 μm by RF magnetron sputtering and the like.

Figure 19:
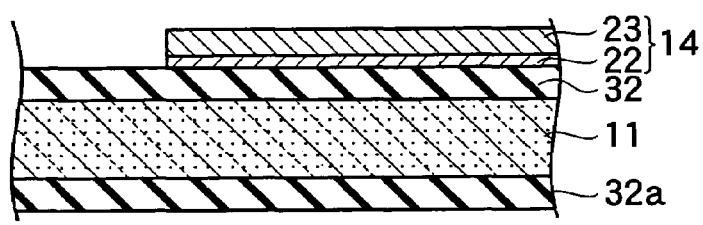

As shown in FIG. 19, an orientation metal film 23 such as Al is deposited by RF magnetron sputtering and the like. The orientation metal film 23 and the amorphous metal film 22 are selectively removed to form a bottom electrode 14 by photolithography, RIE using a chloride based gas or a fluoride based gas, and the like.

Figure 20:
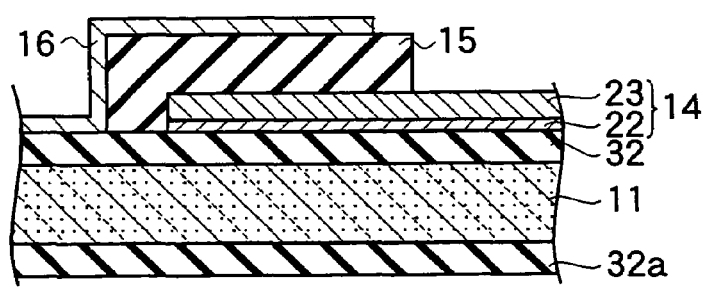

A piezoelectric film 15 such as AlN is deposited at a thickness of about 1.7 μm by RF magnetron sputtering and the like, as shown in FIG. 20. The piezoelectric film 15 is selectively removed by photolithography, RIE using a chloride based gas, and the like. A metal layer such as Al is further deposited on the piezoelectric film 15 by RF magnetron sputtering and the like. The Al metal film is selectively removed to form a top electrode 16 by photolithography, RIE and the like.

Figure 21:
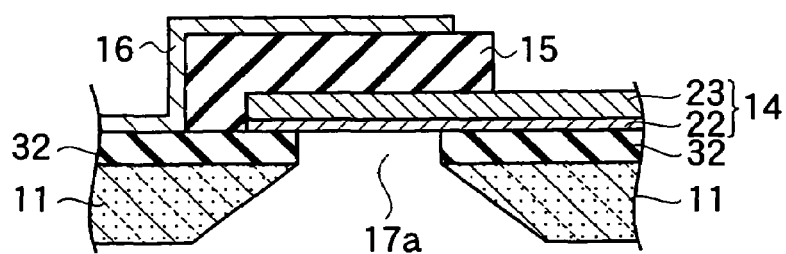

By photolithography, etching and the like, the insulating film 32a is selectively removed to form an opening in which the bottom surface of the substrate 11 is exposed below the bottom electrode 14. As shown in FIG. 21, the substrate 11 is selectively removed from the exposed bottom surface of the substrate 11 in the opening to form a trench using the opening of the bottom surface as a mask by anisotropic etching and the like. The insulation film 32 under the bottom electrode 14 is selectively removed to form the cavity 17a via the trench of the substrate 11 by wet etching using an ammonium fluoride ($NH_4F$) solution, and the like. Thus, a resonator 20 having the bottom electrode 14, the piezoelectric film 15, and the top electrode 16, is formed on top of the cavity 17a, as shown in FIG. 17.

In the second modification of the first embodiment, the amorphous metal layer 22 is evenly deposited on the surface of the insulating film 32. On the surface of the even amorphous metal layer 22, the orientation metal film 23 such as Al can be deposited so as to be highly oriented in the (111) orientation direction. Thus, it is possible to deposit the piezoelectric film 15 to be highly oriented in the c-axis direction. Additionally, since the bottom electrode 14 is formed to cover the cavity 17a, it is possible to increase the mechanical strength of the piezoelectric film 15. The end portion of the bottom electrode 14 is spaced from the upward region of the cavity 17a. Therefore, it is possible to uniformly deposit the piezoelectric film 15 over the cavity 17a.

Frequency characteristics of the manufactured FBAR are measured using a network analyzer and the like. For example, a resonant frequency of the FBAR is about 2.1 GHz. Additionally, an electromechanical coupling constant and a quality factor Q of the piezoelectric film 15 are evaluated from the resonance characteristics of the FBAR. For example, the electromechanical coupling constant is about 6.8%. The quality factor Q is about 950 at a resonance point, and about 900 at an antiresonance point. The electromechanical coupling constant and the quality factor Q are increased. Thus, the piezoelectric film 15 of the FBAR according to the second modification of the first embodiment may provide desirable piezoelectric characteristics.

According to the second modification of the first embodiment, it is possible to highly orient the piezoelectric film 15 in the c-axis direction without using an expensive and complicated growth technology such as epitaxial growth. Thus, it is possible to achieve an FBAR in which the electromechanical coupling constant and quality factor Q are improved.

Third Modification of the First Embodiment

Figure 22:
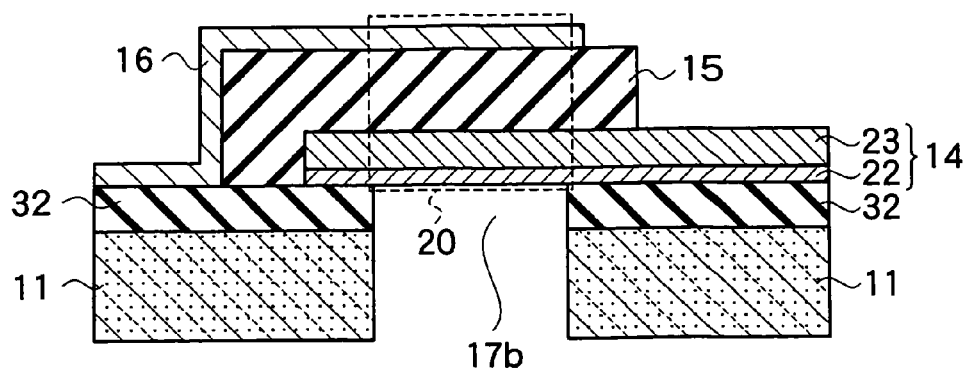
FIG. 22 is a cross section view showing an example of an FBAR according to a third modification of the first embodiment of the present invention.

An FBAR according to a third modification of the first embodiment of the present invention includes a bottom electrode 14 having an amorphous metal film 22 provided on a surface of an insulating film 32 and an orientation metal film 23 provided on a surface of the amorphous metal film 22, as shown in FIG. 22. The bottom electrode 14, a piezoelectric film 15 and a top electrode 16 are supported by the substrate 11 and the insulating film 32, both including a cavity 17b. A resonator 20 is defined by the bottom electrode 14, the piezoelectric film 15 and the top electrode 16, which are provided on the cavity 17b. The cavity 17b has a side wall substantially vertical to the direction extending from a bottom surface of the substrate 11 toward the insulating film 32.

The amorphous metal film 22 of the bottom electrode 14 is, for example, AlTa. The orientation metal film 23 is an orientation metal film of Al or the like, oriented in the (111) orientation direction perpendicular to the surface of the amorphous metal film 22.

The third modification of the first embodiment is different from the second modification of the first embodiment in that the bottom electrode 14 including the amorphous metal film 22 and the orientation metal film 23 is placed on the cavity 17b provided in the substrate 11 and the insulating film 32. Other configurations are as in the second modification of the first embodiment, so duplicated descriptions are omitted.

In the third modification of the first embodiment, the orientation metal film 23 such as Pt, which is oriented, for example, in the (111) orientation direction, is provided on the amorphous metal film 22 of the bottom electrode 14. The piezoelectric film 15 formed on the oriented orientation metal film 23 can be highly aligned in the c-axis direction. Therefore, it is possible to ensure a large electromechanical coupling constant and a high quality factor Q of the piezoelectric film 15. In addition, since the bottom electrode 14 extends to a location on the insulating film 32 over the entire area of the cavity 17b, the mechanical strength of the piezoelectric film 15 may structurally increase. Additionally, above the cavity 17b, the piezoelectric film 15 is evenly formed spaced from a step of an end portion of the bottom electrode 14. Therefore, it is possible to prevent deterioration of orientation of the piezoelectric film 15 in the vicinity of the resonator 20, and to prevent the generation of spurious vibrations in the resonance characteristics of the FBAR.

Next, a manufacturing method of an FBAR according to the third modification of the first embodiment will be described with reference to the cross section views shown in FIGS. 23 to 26.

Figure 23:
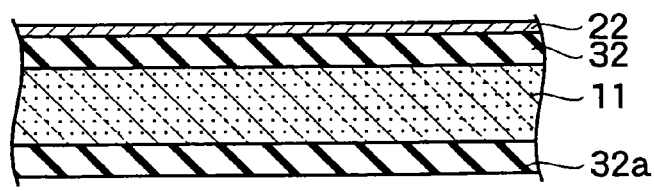
FIGS. 23 to 26 are cross section views showing an example of a manufacturing method of the FBAR according to the third modification of the first embodiment of the present invention.

An insulating film 32, 32a such as $SiO_2$ is formed on top and bottom surfaces of a substrate 11 at a thickness of about 1 μm by thermal oxidation or the like, as shown in FIG. 23. An amorphous metal film 22 such as $Al_{0.4}Ta_{0.6}$ is deposited at a thickness of about 0.2 μm by RF magnetron sputtering and the like.

Figure 24:
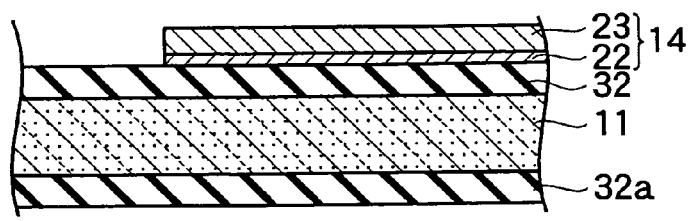

A metal layer such as Pt is deposited by RF magnetron sputtering and the like. As shown in FIG. 24, the Pt metal layer and the amorphous metal film 22 are selectively removed to form a bottom electrode 14 by photolithography, RIE using a chloride based gas or a fluoride based gas, and the like.

Figure 25:
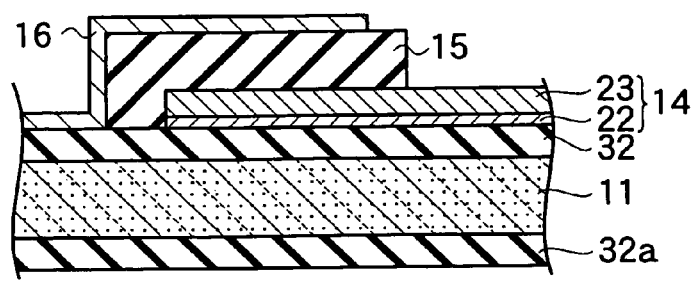

A piezoelectric layer such as AlN is deposited at a thickness of about 1.7 μm by RF magnetron sputtering and the like. As shown in FIG. 25, the AlN piezoelectric layer is selectively removed to form a piezoelectric film 15 by photolithography, RIE using a chloride based gas, and the like. A metal layer such as Pt is further formed on the piezoelectric film 15 by RF magnetron sputtering and the like. The Pt metal layer is selectively removed to form a top electrode 16 by photolithography, RIE and the like.

Figure 26:
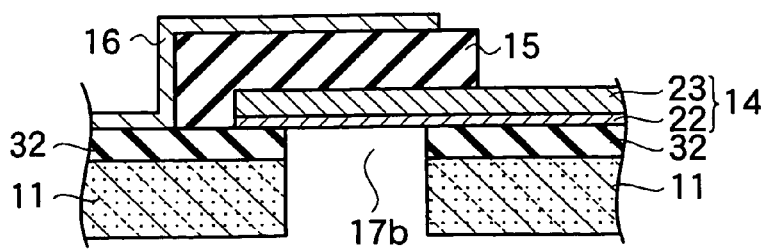

The substrate 11 is thinned by polishing from the insulating film 32a on the bottom surface of the substrate 11 to a thickness of about 200 μm. As shown in FIG. 26, the substrate 11 is selectively and vertically removed by photolithography, RIE using a fluoride based gas, and the like, to form a trench. The insulation film 32 under the bottom electrode 14 is selectively removed to form the cavity 17b via the trench of the substrate 11 by wet etching using an $NH_4F$ solution, and the like. Thus, a resonator 20 having the bottom electrode 14, the piezoelectric film 15, and the top electrode 16, is formed on top of the cavity 17b, as shown in FIG. 22.

In the third modification of the first embodiment, the amorphous metal layer 22 is evenly deposited on the surface of the insulating film 32. On the surface of the even amorphous metal layer 22, the orientation metal film 23 such as Pt can be deposited so as to be highly oriented in the (111) orientation direction. Thus, it is possible to deposit the highly oriented piezoelectric film 15 in the c-axis direction. Additionally, since the bottom electrode 14 is formed to cover the cavity 17b, it is possible to increase the mechanical strength of the piezoelectric film 15. The end portion of the bottom electrode 14 is spaced from the upward region of the cavity 17b. Therefore, it is possible to uniformly deposit the piezoelectric film 15 over the cavity 17b.

Frequency characteristics of the manufactured FBAR are measured using a network analyzer and the like. For example, a resonant frequency of the FBAR is about 2.1 GHz. Additionally, an electromechanical coupling constant and a quality factor Q of the piezoelectric film 15 are evaluated from the resonance characteristics of the FBAR. For example, the electromechanical coupling constant is about 6.7%. The quality factor Q is about 900 at a resonance point, and about 950 at an antiresonance point. The electromechanical coupling constant and the quality factor Q are increased. Thus, the piezoelectric film 15 of the FBAR according to the third modification of the first embodiment may provide desirable piezoelectric characteristics.

According to the third modification of the first embodiment, it is possible to highly orient the piezoelectric film 15 in the c-axis direction without using an expensive and complicated growth technology such as epitaxial growth. Thus, it is possible to achieve an FBAR in which the electromechanical coupling constant and quality factor Q are improved.

Fourth Modification of the First Embodiment

Figure 27:
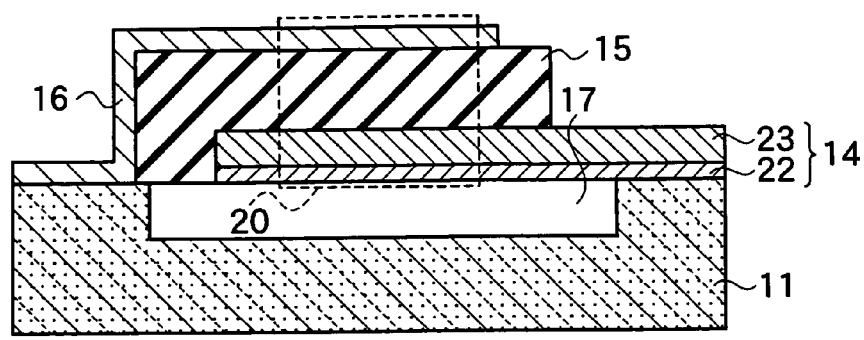
FIG. 27 is a cross section view showing an example of an FBAR according to a fourth modification of the first embodiment of the present invention.

An FBAR according to a fourth modification of the first embodiment of the present invention includes a bottom electrode 14 having an amorphous metal film 22 extending from the substrate 11 onto the top of a cavity 17 provided in the substrate 11 and an orientation metal film 23 provided on a surface of the amorphous metal film 22, as shown in FIG. 27. A resonator 20 is defined by the facing bottom and top electrodes 14, 16 and the piezoelectric film 15 between the bottom and top electrodes 14, 16, which are provided on the cavity 17.

The amorphous metal film 22 of the bottom electrode 14 is, for example, AlTa. The orientation metal film 23 is Pt or the like, oriented in the (111) orientation perpendicular to the surface of the amorphous metal film 22.

The fourth modification of the first embodiment differs from the first and second modifications of the first embodiment in that an end of the bottom electrode 14 is located on the cavity 17 provided in the substrate 11. Other configurations are as in the first and second modifications of the first embodiment, so duplicated descriptions are omitted.

In the fourth modification of the first embodiment, the orientation metal film 23 such as Pt, which is oriented, for example, in the (111) orientation direction, is provided on the amorphous metal film 22 of the bottom electrode 14. The piezoelectric film 15 formed on the oriented orientation metal film 23 can be strongly aligned in the c-axis direction. Therefore, it is possible to ensure a large electromechanical coupling constant and a high quality factor Q of the piezoelectric film 15. In addition, the end of the bottom electrode 14 is located on the cavity 17. Thus, it is possible to prevent formation of a capacitor structure in which the piezoelectric film 15 is sandwiched between the bottom and top electrodes 14, 16, except for a region of the resonator 20. As a result, it is possible to prevent deterioration of the resonance characteristics of the FBAR in a high frequency region.

Next, a manufacturing method of an FBAR according to the fourth modification of the first embodiment will be described in reference to the cross section views as shown in FIGS. 28 to 33.

Figure 28:
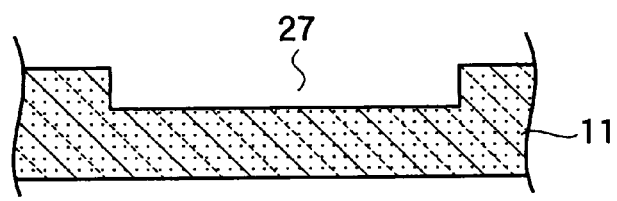
FIGS. 28 to 33 are cross section views showing an example of a manufacturing method of the FBAR according to the fourth modification of the first embodiment of the present invention.

As shown in FIG. 28, a substrate 11 is selectively removed by photolithography, RIE using a fluoride based gas and the like, to form an opening 27.

Figure 29:
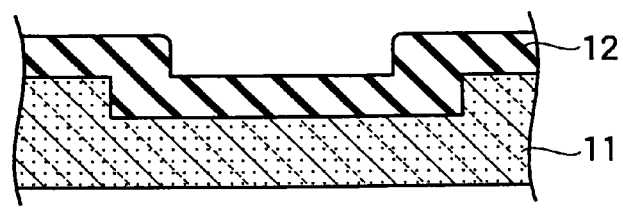
Figure 30:
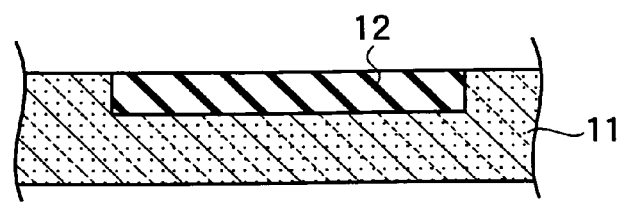

As shown in FIG. 29, a sacrificial layer 12 such as $SiO_2$ is deposited at a thickness of about 1.2 μm on a surface of the substrate 11 by plasma chemical vapor deposition (CVD) and the like. As indicated in FIG. 30, by chemical mechanical polishing (CMP) and the like, the sacrificial layer 12 is planarized so that the surface of the substrate 11 is exposed. In addition, as the sacrificial layer 12, it may be possible to use a metal such as Mo, Al and W, a semiconductor such as germanium (Ge) and poly-Si, insulator such as BPSG and $Si_3N_4$, and the like.

Figure 31:
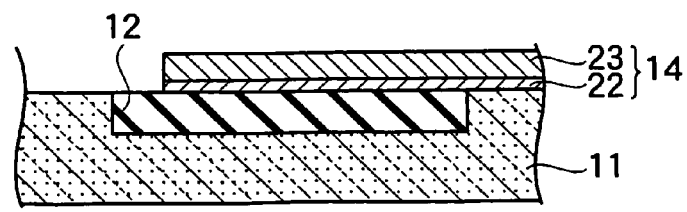

As shown in FIG. 31, an amorphous metal film 22 such as $Al_{0.4}Ta_{0.6}$ is deposited on the surface of the substrate 11 in which the sacrificial layer 12 is embedded, at a thickness of about 0.2 µm by RF magnetron sputtering and the like. An orientation metal film 23 such as Pt is deposited by RF magnetron sputtering and the like. The orientation metal film 23 and the amorphous metal film 22 are selectively removed by photolithography, RIE using a chloride based gas, and the like, to form a bottom electrode 14.

Figure 32:
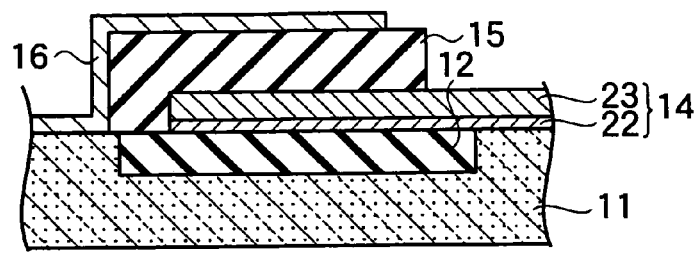

As shown in FIG. 32, a piezoelectric film 15 such as AlN is deposited at a thickness of about 1.7 µm by reactive RF magnetron sputtering and the like. The piezoelectric film 15 is selectively removed by photolithography, RIE using a chloride based gas, and the like. A metal layer such as Ir is further deposited on the piezoelectric film 15 by RF magnetron sputtering and the like. The Ir metal layer is selectively removed by photolithography, RIE using a fluoride based gas and the like, to form a top electrode 16.

Figure 33:
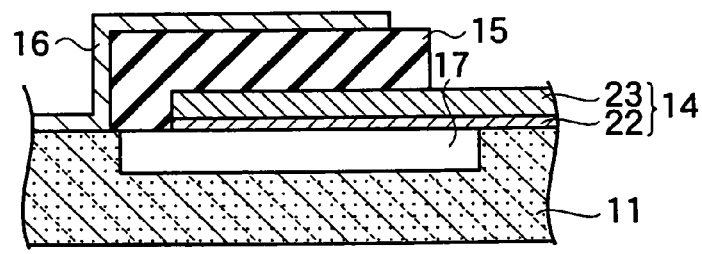

The piezoelectric film 15 is selectively removed by photolithography, RIE using a chloride based gas, and the like, to form a via hole (not illustrated) so as to expose the sacrificial layer 12 above the surface of the substrate 11. As shown in FIG. 33, the sacrificial layer 12 is selectively dissolved through the via hole by wet etching using an $NH_4F$ solution, and the like, to form a cavity 17.

In the fourth modification of the first embodiment, the amorphous metal layer 22 is evenly deposited on the surface of the even substrate 11 in which the sacrificial layer 12 is embedded. The orientation metal film 23 such as Pt can be deposited to highly align in the (111) orientation direction on the even surface of the amorphous metal film 22. As a result, it is possible to deposit the highly oriented piezoelectric film 15 in the c-axis direction. The end portion of the bottom electrode 14 is spaced from the upward region of the cavity 17. Therefore, it is possible to uniformly deposit the piezoelectric film 15 over the cavity 17.

Frequency characteristics of the manufactured FBAR are measured using a network analyzer and the like. For example, a resonant frequency of the FBAR is about 2.1 GHz. Additionally, an electromechanical coupling constant and a quality factor Q of the piezoelectric film 15 are evaluated from the resonance characteristics of the FBAR. For example, the electromechanical coupling constant is about 6.9%. The quality factor Q is about 1100 at a resonance point, and about 1150 at an antiresonance point. The electromechanical coupling constant and the quality factor Q are increased. Thus, the piezoelectric film 15 of the FBAR according to the fourth modification of the first embodiment may provide desirable piezoelectric characteristics.

According to the fourth modification of the first embodiment, it is possible to highly orient the piezoelectric film 15 in the c-axis direction without using an expensive and complicated growth technology such as epitaxial growth. Thus, it is possible to achieve an FBAR in which the electromechanical coupling constant and quality factor Q are improved.

Fifth Modification of the First Embodiment

Figure 34:
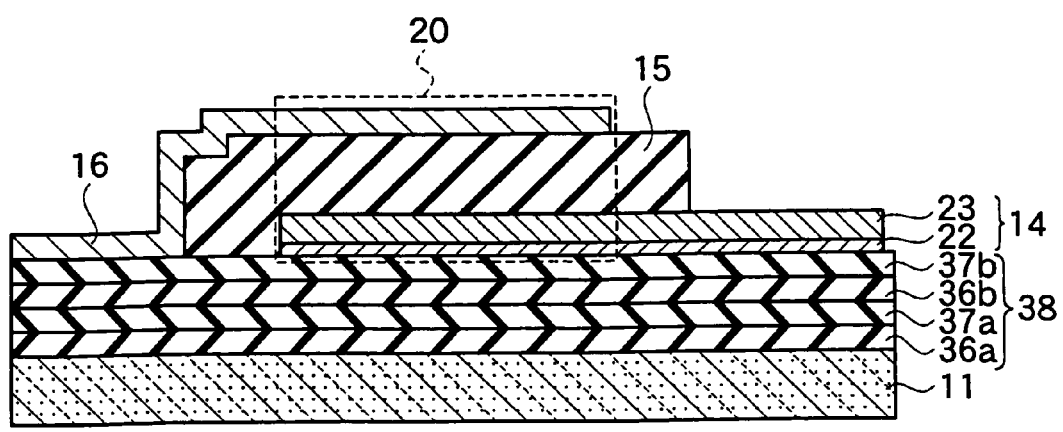
FIG. 34 is a cross section view showing an example of an FBAR according to a fifth modification of the first embodiment of the present invention.

In an FBAR according to a fifth modification of the first embodiment of the present invention, a bottom electrode 14, a piezoelectric film 15 and a top electrode 16 are provided on an acoustic reflection layer 38 provided on a substrate 11, as shown in FIG. 34. A resonator 20 is defined by the facing bottom and top electrodes and the piezoelectric film 15 between the bottom and top electrodes 14, 16, on the acoustic reflection layer 38.

In the acoustic reflection layer 38, first acoustic impedance layers 36a, 36b having a high acoustic impedance and second acoustic impedance layers 37a, 37b having a low acoustic impedance are alternately laminated. The thickness of each of the first and second acoustic impedance layers 36a, 37a, 36b, 37b is about ¼ the wavelength of the bulk acoustic wave excited by the resonator 20. The bulk acoustic wave is reflected by the first and second acoustic impedance layers 36a, 37a, 36b, 37b periodically placed at a thickness of about ¼ the wavelength of the acoustic wave. The acoustic impedance is determined by the density and the elastic constant of a material. A suitable example of material having high acoustic impedance includes an insulator such as AlN, tantalum oxide ($Ta_2O_5$) or $Al_2O_3$, and a metal such as W, Mo, Pt, Ir, Ru, rhodium (Rh) or Ta. A suitable example of material having low acoustic impedance includes an insulator such as $SiO_2$ or $Si_3N_4$, a semiconductor such as Si, and a metal such as Al or titanium (Ti).

For the acoustic reflection layer 38, the first and second acoustic impedance layers 36a, 36b, 37a, 37b are laminated. However, the number of lamination layers of the acoustic reflection layer 38 is not limited. The number of lamination layers may be determined depending on a material to be used so that the quality factor Q increases to a maximum extent.

The fifth modification of the first embodiment is different from the fourth modification of the first embodiment in that the resonator 20 is provided on the acoustic reflection layer 38 on the substrate 11. The other configurations are as in the fourth modification of the first embodiment, so duplicated descriptions are omitted.

In the fifth modification of the first embodiment, a piezoelectric vibration excited in the piezoelectric film 15 is reflected and effectively confined within the resonator 20 by the acoustic reflection layer 38 provided below the resonator 20. Therefore, it is possible to prevent deterioration of the resonance characteristics of the resonator 20. Additionally, the highly orientation metal film 23 is provided on the amorphous metal film 22 of the bottom electrode 14. The piezoelectric film 15 provided on the oriented orientation metal film 23 can be strongly aligned in the c-axis direction. Therefore, it is possible to ensure a large electromechanical coupling constant and a high quality factor Q of the piezoelectric film 15. Furthermore, since the bottom electrode 14 is placed on the even acoustic reflection layer 38, the mechanical strength of the piezoelectric film 15 may structurally increase.

Next, a manufacturing method of an FBAR according to the fifth modification of the first embodiment will be described with reference to the cross section views as shown in FIGS. 35 to 38.

Figure 35:
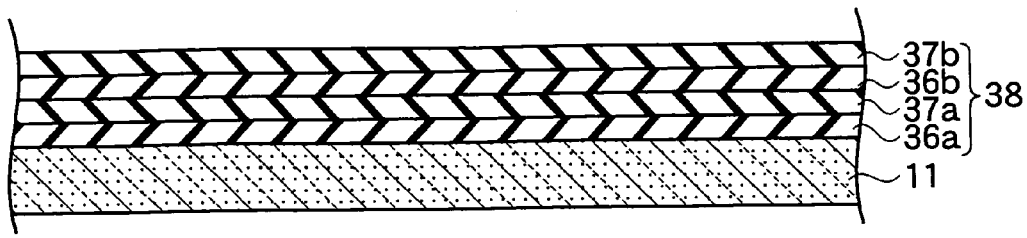
FIGS. 35 to 38 are cross section views showing an example of a manufacturing method of the FBAR according to the fifth modification of the first embodiment of the present invention.

As shown in FIG. 35, a first acoustic impedance layer 36a, a second acoustic impedance layer 37a, a first acoustic impedance layer 36b and a second acoustic impedance layer 37b are sequentially deposited to form an acoustic reflection layer 38 on a surface of a substrate 11 by sputter, CVD, and the like. A surface of the acoustic reflection layer 38 may be planarized by CMP and the like to provide an even surface on the acoustic reflection layer 38. In addition, an insulator is desirably used for at least the second acoustic impedance layer 37b, that is the uppermost layer.

Figure 36:
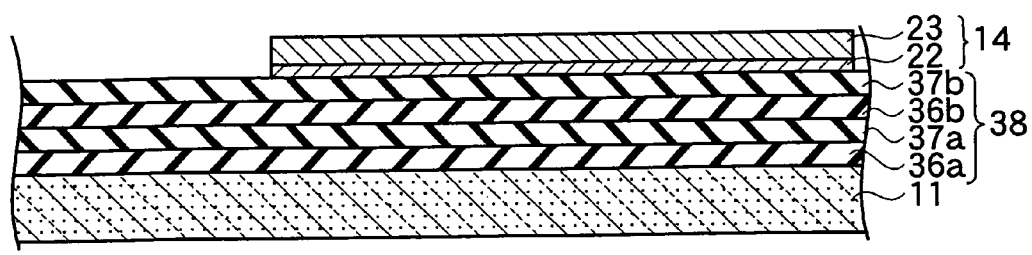

As shown in FIG. 36, an amorphous metal film 22 such as $Al_{0.4}Ta_{0.6}$ is deposited at a thickness of about 20 nm on the surface of the acoustic reflection layer 38 by RF magnetron sputtering and the like. Thereafter, an orientation metal film 23 such as Ni is deposited at a thickness of about 250 nm by DC magnetron sputter and the like. The orientation metal film 23 and the amorphous metal film 22 are selectively removed by photolithography, etching and the like, to form a bottom electrode 14.

Figure 37:
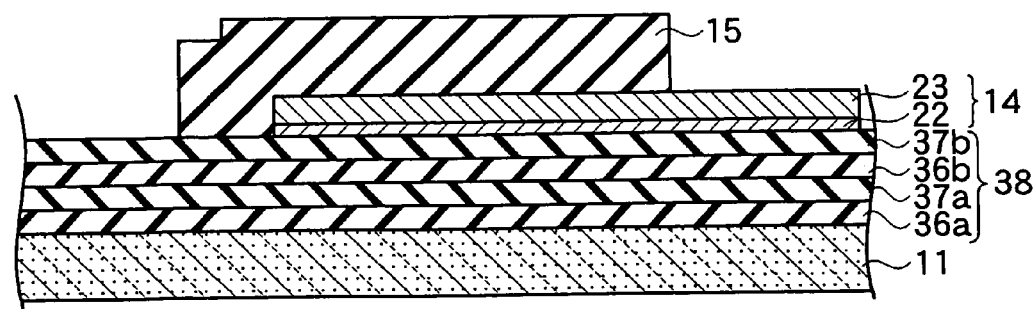

As shown in FIG. 37, a piezoelectric layer such as AlN is deposited at a thickness of about 2 μm by reactive RF magnetron sputtering and the like. The AlN piezoelectric layer is selectively removed by photolithography, RIE using a chloride based gas, and the like, to form a piezoelectric film 15.

Figure 38:
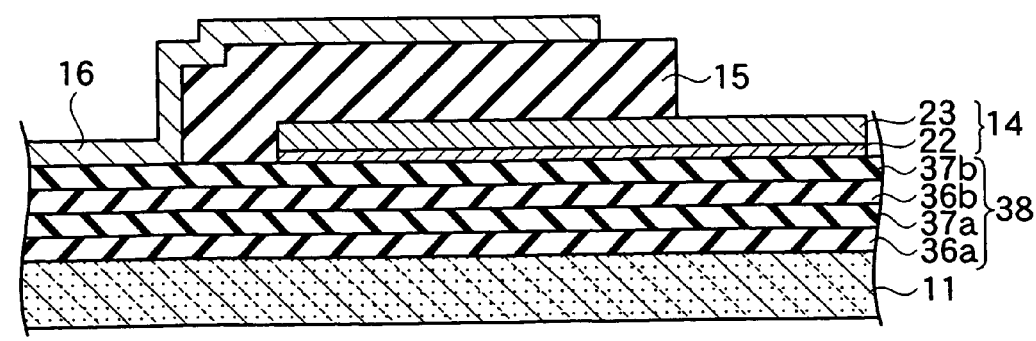

As shown in FIG. 38, a metal layer such as Mo is deposited on the piezoelectric film 15 by DC magnetron sputter and the like. The Mo metal layer is selectively removed by photolithography, wet etching and the like, to form a top electrode 16.

The orientation of the Ni orientation metal film 23 deposited on the surface of the amorphous metal film 22 is determined by XRD. This confirms that the Ni orientation metal film 23 is highly aligned in the (111) orientation direction at an orientation FWHM of about 0.7°.

In the fifth modification of the first embodiment, the even amorphous metal layer 22 is deposited on the even amorphous metal film 22 surface. On the even surface of the amorphous metal film 22, the orientation metal film 23 such as Ni can be deposited to highly align in the (111) orientation direction. Thus, it is possible to deposit the piezoelectric film 15 to be highly oriented in the c-axis direction. Additionally, since the bottom electrode 14 is formed on the even surface of the acoustic reflection layer 38, it is possible to structurally increase the mechanical strength of the piezoelectric film 15.

Frequency characteristics of the manufactured FBAR are measured using a network analyzer and the like. For example, a resonant frequency of the FBAR is about two GHz. Additionally, an electromechanical coupling constant and a quality factor Q of the piezoelectric film 15 are evaluated from the resonance characteristics of the FBAR. For example, the electromechanical coupling constant is about 6.5% to about 6.7%. The quality factor Q is about 900 to about 1000 at a resonance point, and about 800 to about 900 at an antiresonance point. The electromechanical coupling constant and the quality factor Q are increased compared to an FBAR using an epitaxially grown single crystal piezoelectric film. Thus, the piezoelectric film 15 of the FBAR according to the fifth modification of the first embodiment may provide desirable piezoelectric characteristics.

According to the fifth modification of the first embodiment, it is possible to highly orient the piezoelectric film 15 in the c-axis direction without using an expensive and complicated deposition technology such as epitaxial growth. Thus, it is possible to achieve an FBAR in which the electromechanical coupling constant and quality factor Q are improved.

Sixth Modification of the First Embodiment

Figure 39:
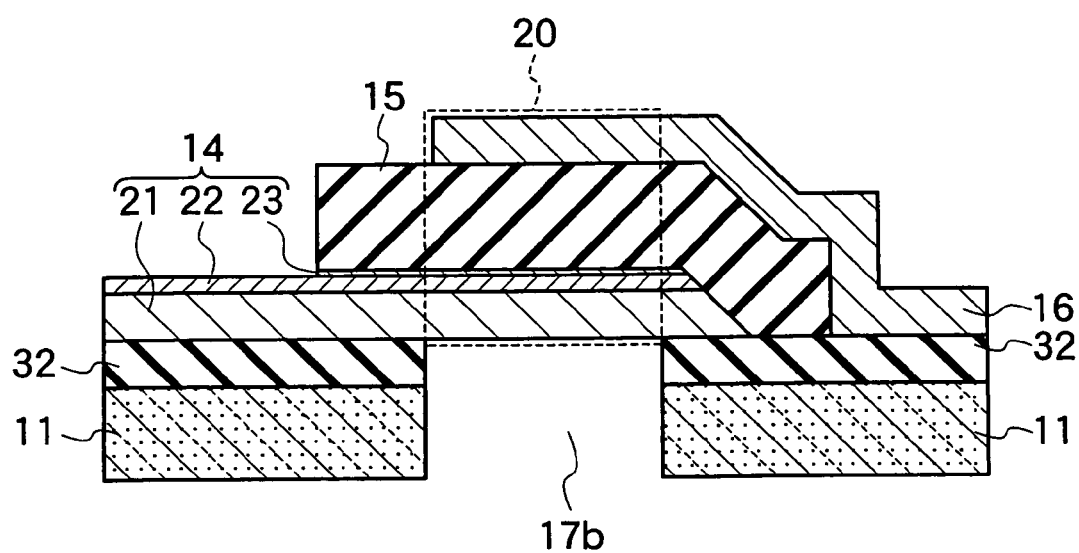
FIG. 39 is a cross section view showing an example of an FBAR according to a sixth modification of the first embodiment of the present invention.

An FBAR according to a sixth modification of the first embodiment of the present invention includes a bottom electrode 14 having a low resistance metal film 21 placed on a surface of an insulating film 32, an amorphous metal film 22 placed on the surface of the low resistance metal film 21, and an orientation metal film 23 placed on a surface of the amorphous metal film 22, as shown in FIG. 39. The bottom electrode 14, a piezoelectric film 15 and a top electrode 16 are supported by the substrate 11 and the insulating film 32, both including a cavity 17b. An end portion of the bottom electrode 14 covered with the piezoelectric film 15 is inclined at an angle less than a right angle relative to the insulating film 32 surface. A resonator 20 is defined by the bottom electrode 14, the piezoelectric film 15 and the top electrode 16, which are provided on the cavity 17b. The cavity 17b has a side wall substantially vertical to the direction from which a bottom surface of the substrate 11 extends toward the insulating film 32.

The low resistance metal film 21 of the bottom electrode 14 is a metal having a low resistivity. The resistivity of the low resistance metal film 21 at room temperature is in a range from about $1\times10^{-8}$ Ωm to about $10\times10^{-8}$ Ωm, desirably about $1\times10^{-8}$ Ωm to about $5\times10^{-8}$ Ωm, and more desirably about $1\times10^{-8}$ Ωm to about $3\times10^{-8}$ Ωm. As the low resistance metal film 21, such a metal including Al, Cu, Au, Ag, Ir, Ni, Pt, Mo, W, and the like, may be used. Additionally, an alloy that contains a low resistivity metal such as Al, Cu, Au, or Ag, in major proportions with the addition of about 10% or less by composition, desirably about 5% or less of metals such as Ni, Pt, Mo, W, and the like, by composition, may be used. Furthermore, it may be permissible to add Si, carbon (C), and the like, to the alloy in an amount of about 5% or less by composition.

The sixth modification of the first embodiment differs from the third modification of the first embodiment in that, on the insulating film 32 surface, the bottom electrode 14 including the low resistance metal film 21, the amorphous metal film 22 and the orientation metal film 23 is placed on the cavity 17b provided in the substrate 11 and the insulating film 32. Other configurations are as in the third modification of the first embodiment, so duplicated descriptions are omitted.

In the sixth modification of the first embodiment, the oriented orientation metal film 23 is provided on the amorphous metal film 22 of the bottom electrode 14. The piezoelectric film 15 formed on the oriented orientation metal film 23 can be strongly aligned in the c-axis direction. Therefore, it is possible to ensure a large electromechanical coupling constant and a high quality factor Q of the piezoelectric film 15. In addition, since the low resistance metal film 21 provided under the amorphous metal film 22 may be of low resistance, it is possible to prevent deterioration of high frequency characteristics.

Next, a manufacturing method of an FBAR according to the sixth modification of the first embodiment will be described with reference to the cross section views shown in FIGS. 28 to 33.

Figure 40:
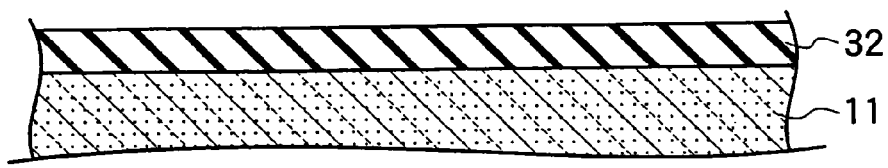
FIGS. 40 to 44 are cross section views showing an example of a manufacturing method of the FBAR according to the sixth modification of the first embodiment of the present invention.

As shown in FIG. 40, an insulating film 32 such as $SiO_2$ is formed on a surface of a substrate 11 at a thickness of about 1 μm by thermal oxidation and the like. For example, an Al alloy, an AlTa amorphous metal and an Al metal are deposited, respectively, at thicknesses of about 200 nm, about 100 nm and about 5 nm by sputtering and the like while maintaining the temperature of the substrate at near room temperature.

Figure 41:
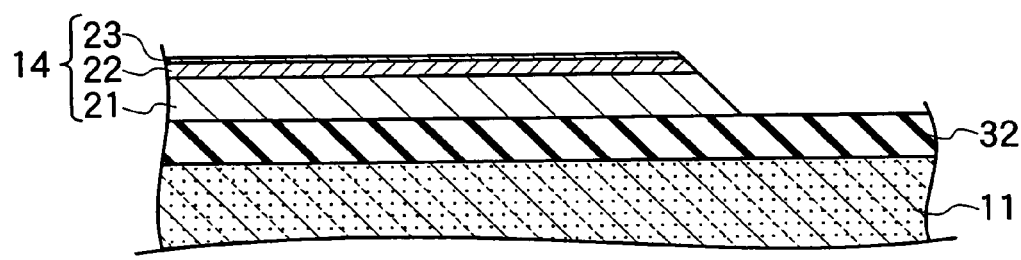

As shown in FIG. 41, the Al metal layer, the AlTa amorphous metal layer and the Al alloy layer are selectively removed by photolithography, RIE and the like to form a bottom electrode 14 having a low resistance metal film 21, an amorphous metal film 22 and an orientation metal film 23. Additionally, an end portion of the bottom electrode 14 may be inclined using a resist mask having an inclined end portion by adjusting photolithography conditions.

Figure 42:
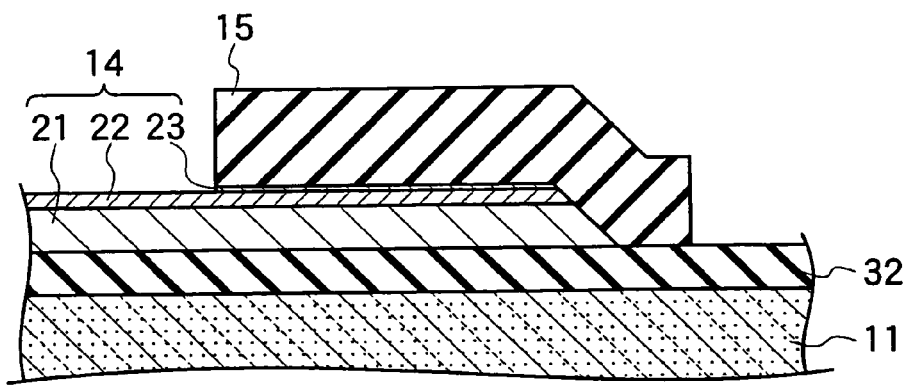

A piezoelectric layer such as AlN is deposited to a desired thickness by sputtering and the like. As shown in FIG. 42, the AlN piezoelectric layer is selectively removed by photolithography, RIE and the like to form a piezoelectric layer 15. In addition, the etching of the AlN piezoelectric layer may also be wet etching using an alkaline solution.

Figure 43:
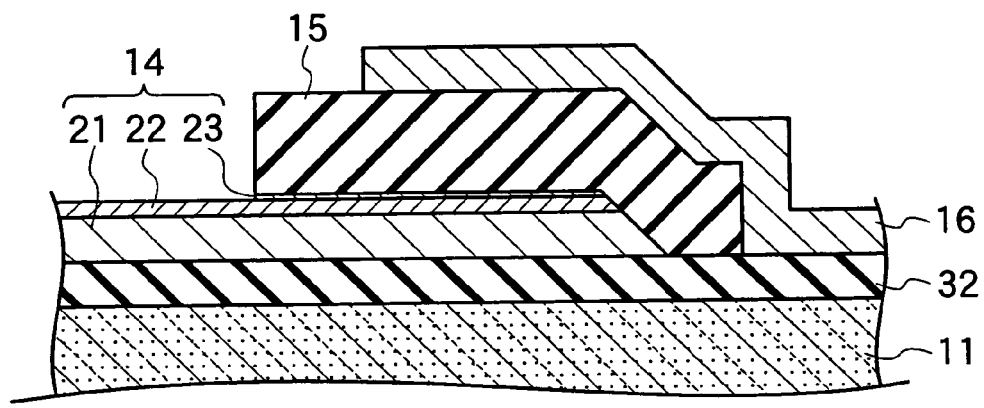

An Al alloy layer is deposited on the piezoelectric film 15 by sputtering and the like. As shown in FIG. 43, the Al alloy layer is selectively removed by photolithography, wet etching and the like, to form a top electrode 16.

Figure 44:
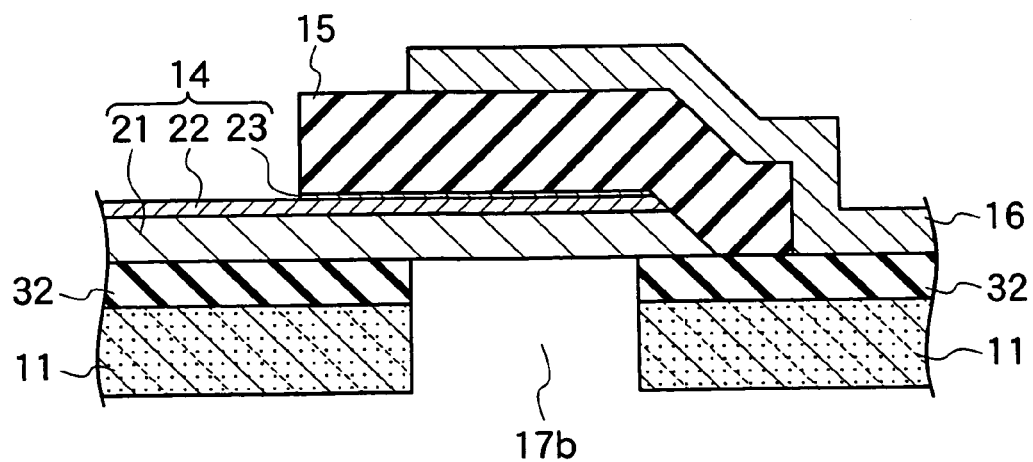

The substrate 11 is thinned by polishing or the like from the bottom surface of the substrate 11 to a thickness of about 200 μm. As shown in FIG. 44, the substrate 11 is selectively removed by photolithography, RIE and the like from the bottom surface to form a trench. The insulating film 32 under the bottom electrode 14 is selectively removed by wet etching and the like to form a cavity 17b via the trench of the substrate 11. Thus, a resonator 20 having the bottom electrode 14, the piezoelectric film 15, and the top electrode 16, is formed on top of the cavity 17b, as shown in FIG. 39.

After the Al alloy layer of the low resistance layer 21, or the AlTa amorphous metal layer of the amorphous metal film 22 is deposited, the processing substrate 11 may be exposed once to the atmosphere to form an oxide film on a surface of the Al alloy layer or the AlTa amorphous metal layer. The formation of the surface oxide film may improve the orientation of an Al metal film of the orientation metal film 23 and an AlN piezoelectric layer of the piezoelectric film 15.

Additionally, the exposed amorphous metal film 22 that is not covered by the piezoelectric film 15 may be removed. The exposed amorphous metal 22 may be removed, for example, by RIE or chemical dry etching (CDE) or the like, continuously after etching of the piezoelectric film 15.

According to the above descriptions, the low resistance metal film 21 is deposited at a thickness of about 200 nm. As the thickness of the low resistance metal film 21 is increased, the resistance is decreased. Therefore, a thicker film is desirable for the low resistance metal film 21. Additionally, the amorphous metal film 22 is deposited at a thickness of about 100 nm. The amorphous metal layer 22 can be used as an etching stop layer in etching of the piezoelectric film 15. For instance, the selectivity of etching for AlN to AlTa is varied depending on etching conditions. Thus, the thickness of the amorphous metal film 22 may be determined according to the selectivity of etching for the piezoelectric film 15 to the amorphous metal film 22. In addition, to ensure evenness of the amorphous metal film 22, a thickness of about 5 nm may be desirable. Furthermore, the orientation metal film 23 is deposited at a thickness of about 5 nm. The thickness of the orientation metal film 23, however, is not limited. The orientation metal film 23 may be in a thickness range from about 3 nm to about 10 nm.

When a resonance frequency of the FBAR, and metals used for the bottom and top electrodes 14, 16 are determined, the electrode thicknesses of the bottom and top electrodes 14, 16 are substantially uniquely determined by the density and the elastic constant of the metal. When both the density and elastic constant of the metal are small, the electrode thickness can be large. Therefore, in order to decrease the resistances of the bottom and top electrodes 14, 16, a metal having low resistivity, with a small density and a small elastic constant is desirable. For example, a metal such as Al and Cu, and an alloy containing Al, Cu, and the like, in major proportions, may be desirable.

Resistivity of AlTa used as the amorphous metal film 22 is about two orders of magnitude higher than a low resistivity metal such as Al. The orientation metal film 23 directly below the piezoelectric film 15 is removed during etching of the piezoelectric film 15. Since the amorphous metal film 22 serves as an etching stop layer in the etching of the piezoelectric film 15, the low resistance metal layer 21 under the amorphous metal layer 22 is not etched. In the sixth modification of the first embodiment, as the low resistance metal film 21, the Al alloy having a low resistivity, with a small density and a small elastic constant is used. Thus, the electrode thickness may be increased so as to lower the resistance of the bottom and top electrodes 14, 16. Therefore, it is possible to prevent deterioration of resonance characteristics in a high frequency region.

In the sixth modification of the first embodiment, the low resistance metal film 21 and the amorphous metal layer 22 are evenly deposited on the insulating film 32 surface. On the even surface of the amorphous metal film 22, the orientation metal film 23 such as Al can be deposited to highly align in the (111) orientation direction. As a result, it is possible to deposit the piezoelectric film 15 to be highly oriented in the c-axis direction. Additionally, since the bottom electrode 14 is formed to cover the cavity 17b, it is possible to increase the mechanical strength of the piezoelectric film 15.

Seventh Modification of the First Embodiment

Figure 45:
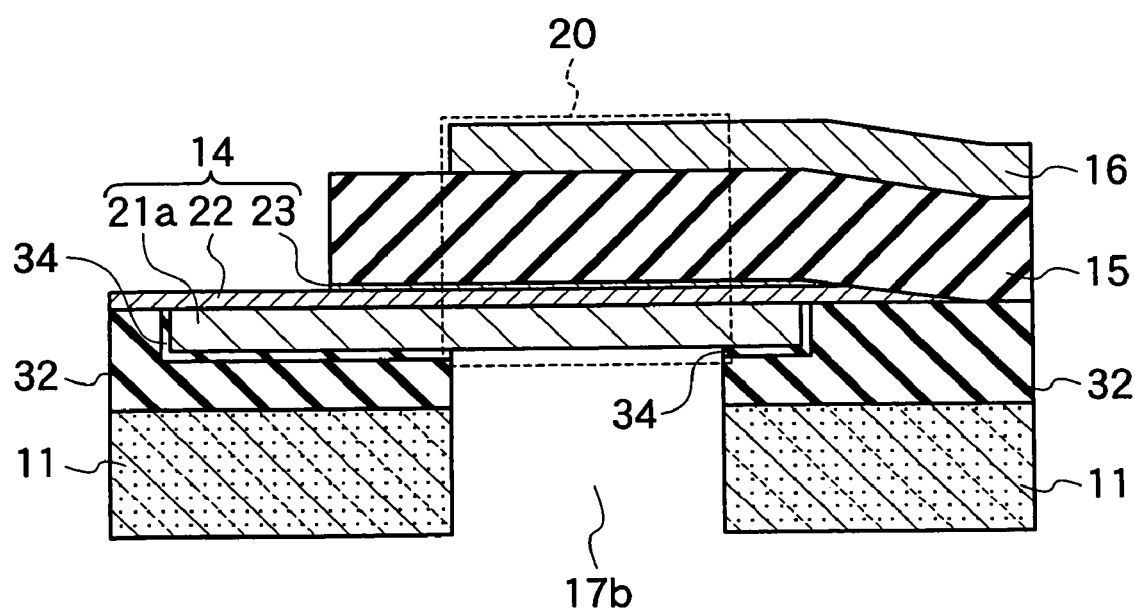
FIG. 45 is a cross section view showing an example of an FBAR according to a seventh modification of the first embodiment of the present invention.

An FBAR according to a seventh modification of the first embodiment of the present invention includes a bottom electrode 14 having a low resistance metal film 21a embedded in the insulating film 32 via a barrier film 34, an amorphous metal film 22 placed on even surfaces of the embedded low resistance metal film 21a and insulating film 32, and an orientation metal film 23 placed on a surface of the amorphous metal film 22, as shown in FIG. 45. An end portion of the bottom electrode 14 covered with the piezoelectric film 15 is inclined at an angle less than a right angle relative to the insulating film 32 surface. The piezoelectric film 15 extends to the inclination end portion side of the bottom electrode 14. The top electrode 16 is provided so as to extend to the surface of the piezoelectric film 15. A resonator 20 is defined by the bottom electrode 14, the piezoelectric film 15 and the top electrode 16, which are provided on the cavity 17b.

The seventh modification of the first embodiment is different from the sixth modification of the first embodiment in that the low resistance metal film 21a is provided by being embedded in the insulating film 32. Other configurations are as in the sixth modification of the first embodiment, so duplicated descriptions are omitted.

In the seventh modification of the first embodiment, the oriented orientation metal film 23 is provided on the amorphous metal film 22 of the bottom electrode 14. The piezoelectric film 15 formed on the oriented orientation metal film 23 can be highly oriented in the c-axis direction. Therefore, it is possible to ensure a large electromechanical coupling constant and a high quality factor Q of the piezoelectric film 15. In addition, since the low resistance metal film 21 is embedded in the insulating film 32, a step section of a inclined end portion of the bottom electrode 14 may decrease. Therefore, it is possible to prevent deterioration of orientation of the piezoelectric film 15 in the vicinity of the resonator 20, and to prevent the generation of a spurious vibration in the resonance characteristics of the FBAR.

Next, a manufacturing method of an FBAR according to the seventh modification of the first embodiment will be described with reference to the cross section views as shown in FIGS. 46 to 51.

Figure 46:
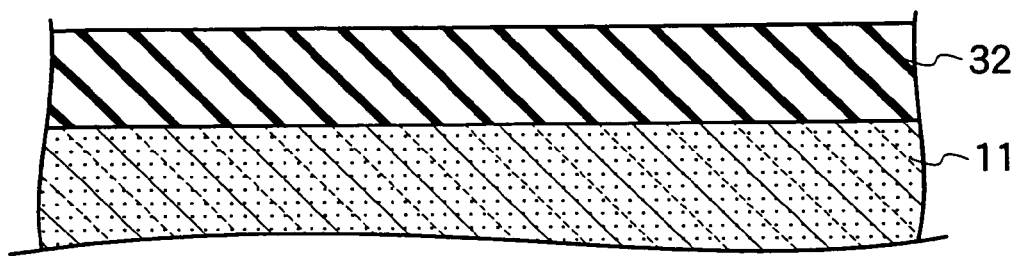
FIGS. 46 to 51 are cross section views showing an example of a manufacturing method of the FBAR according to the seventh modification of the first embodiment of the present invention.
Figure 47:
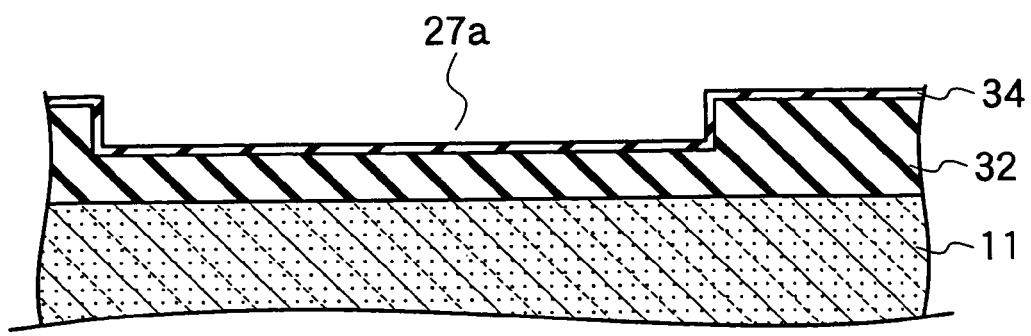

As shown in FIG. 46, an insulating film 32 such as SiO$_2$ is formed at a thickness of about 1.3 µm on a surface of a substrate 11 by thermal oxidation or the like. As shown in FIG. 47, the insulating film 32 is selectively removed by photolithography, RIE and the like to form a groove 27a. A barrier film 34 such as Si$_3$N$_4$ is deposited on a surface of the insulating film 32 having the groove 27a by CVD and the like.

Figure 48:
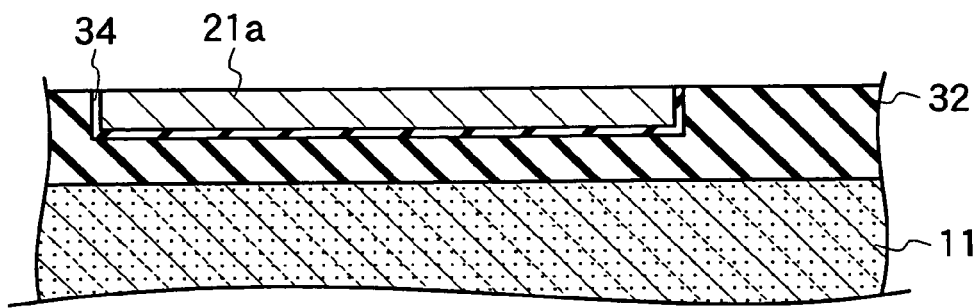

As shown in FIG. 48, a low resistance metal film 21a such as Cu is deposited on a surface of the barrier film 34 by sputtering and the like, so that the groove 25a is embedded. The low resistance metal film 21a is planarized by CMP and the like, so that the surface of the insulating film 32 is exposed.

Figure 49:
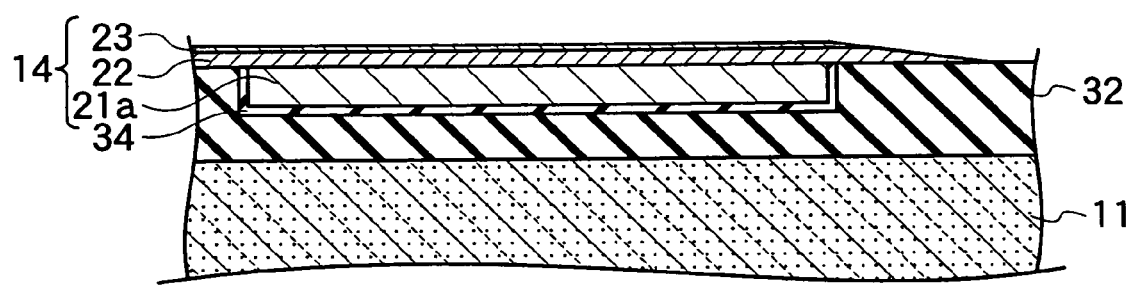

As shown in FIG. 49, for example, an Al alloy film, an AlTa amorphous metal film and an Al metal film are deposited, respectively, at thicknesses of about 200 nm, about 100 nm and about 5 nm by sputtering and the like. The Al metal layer, the AlTa amorphous metal layer and the Al alloy layer are selectively removed by photolithography, RIE and the like to form a bottom electrode 14 including the low resistance metal film 21, an amorphous metal film 22 and an orientation metal film 23. Additionally, end portions of the amorphous metal film 22 and the orientation metal film 23 may be inclined using a resist mask having an inclined end portion, by adjusting photolithography conditions.

Figure 50:
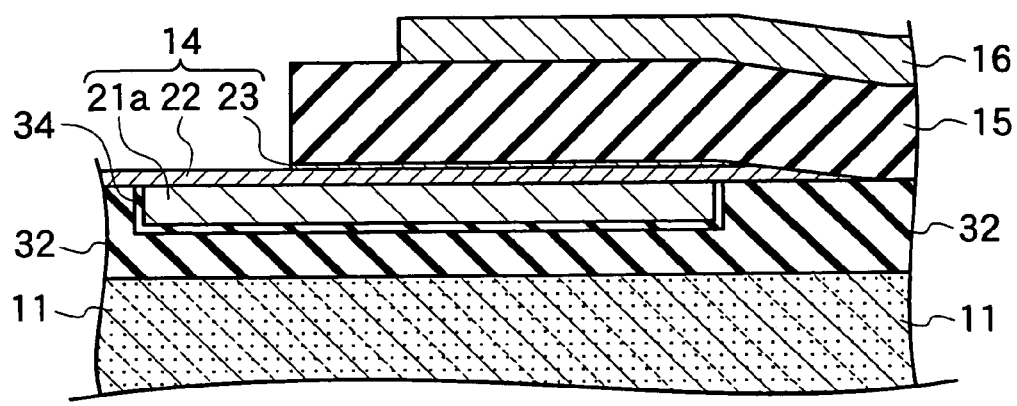

As shown in FIG. 50, a piezoelectric layer such as AlN is deposited to a desired thickness by sputtering and the like. A Cu alloy layer and the like are deposited at a thickness of, for example, about 300 nm on the piezoelectric film 15 by sputtering and the like. The Cu alloy layer is selectively removed by photolithography, wet etching and the like to form a top electrode 16. Subsequently, the AlN piezoelectric layer is selectively removed by photolithography, RIE and the like, to form a piezoelectric film 15.

Figure 51:
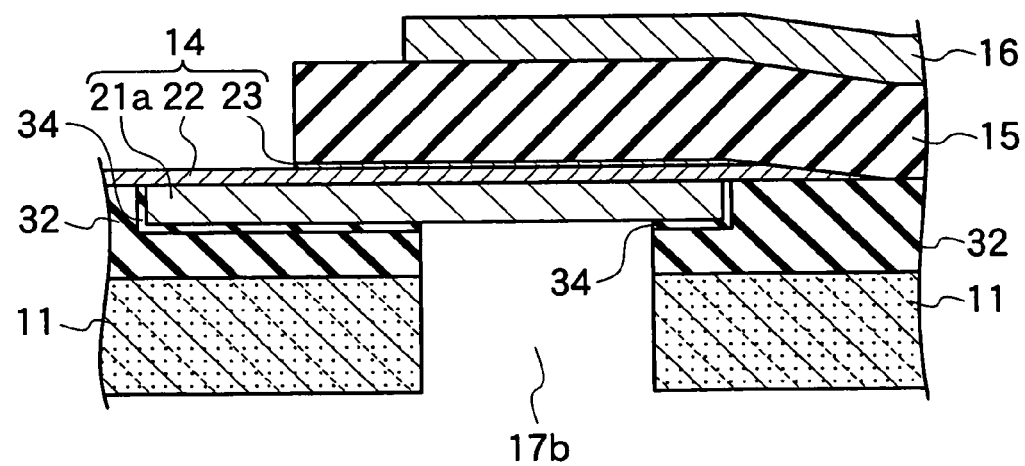

The substrate 11 is thinned by polishing or the like from the bottom surface of the substrate 11 to a thickness of about 200 µm. As shown in FIG. 51, the substrate 11 is selectively removed from the bottom surface by photolithography, RIE and the like to form a trench. The insulating film 32 under the bottom electrode 14 is selectively removed through the trench of the substrate 11 by wet etching and the like to form a cavity 17b. Thus, a resonator 20 including the bottom electrode 14, the piezoelectric film 15, and the top electrode 16, is formed on top of the cavity 17b, as shown in FIG. 45.

In the seventh medication of the first embodiment, as the low resistance metal film 21a, a Cu alloy having a low resistivity, with a small density and a small elastic constant is used. Thus, the electrode thickness may be thicken to lower the resistance of the bottom and top electrodes 14, 16. Therefore, it is possible to prevent deterioration of resonance characteristics in a high frequency region.

Application of the First Embodiment

As an application of FBARs according to the first embodiment of the present invention, a phase locked loop (PLL) circuit will be described. The PLL circuit generates the reference frequency of a frequency synthesizer used for cellular phones and the like.

Figure 52:
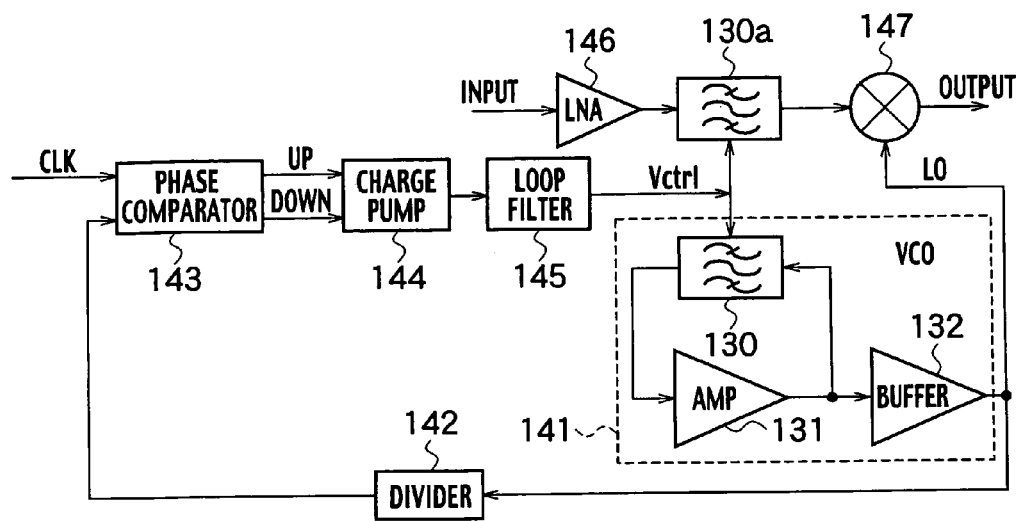
FIG. 52 is a block diagram showing an example of a phase locked loop circuit according to an application example of the first embodiment of the present invention.
Figure 53:
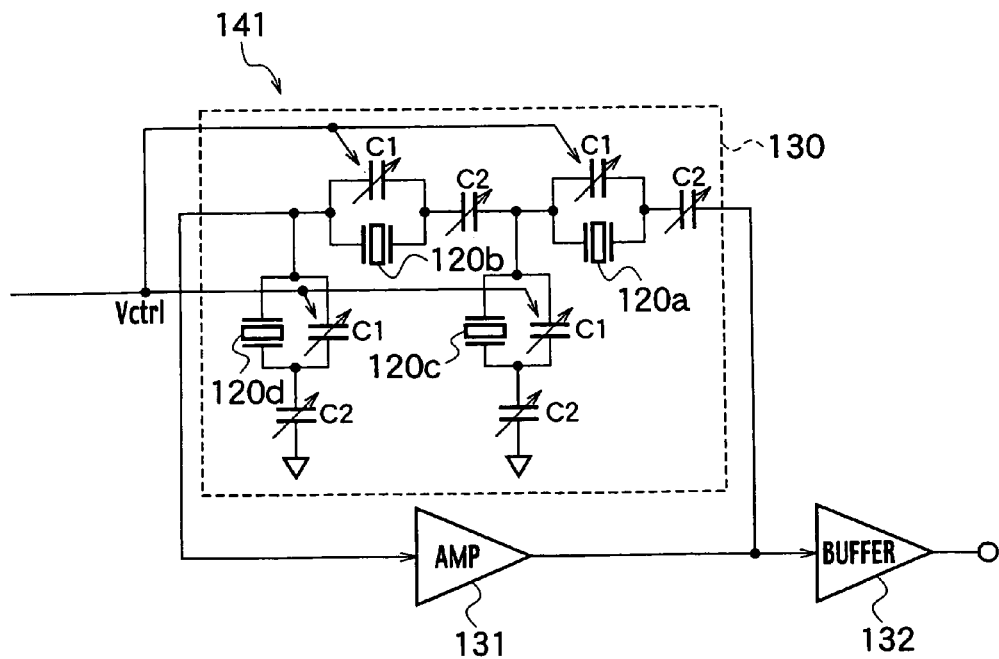
FIG. 53 is a block diagram showing an example of piezoelectric control transmitter according to an application example of the first embodiment of the present invention.

As shown in FIG. 52, a PLL circuit includes a VCO 141 having a frequency variable filter 130, an amplifier 131 and a buffer amplifier 132, a frequency divider 142, a phase comparator 143, a charge pump 144, a loop filter 145, a low noise amplifier (LNA) 146, a frequency variable filter 130a, and a mixer 147.

The VCO 141 feeds back to the input of the amplifier 131 only the frequency components passing through the frequency variable filter 130. The VCO 141 has a plurality of FBARs 120a, 120b, 120c and 120d, and a plurality of variable capacitors C1, C2. As the FBARs 120a to 120d, the FBARs according to the first embodiment and the first to seventh modifications of the first embodiment may be used.

Figure 54:
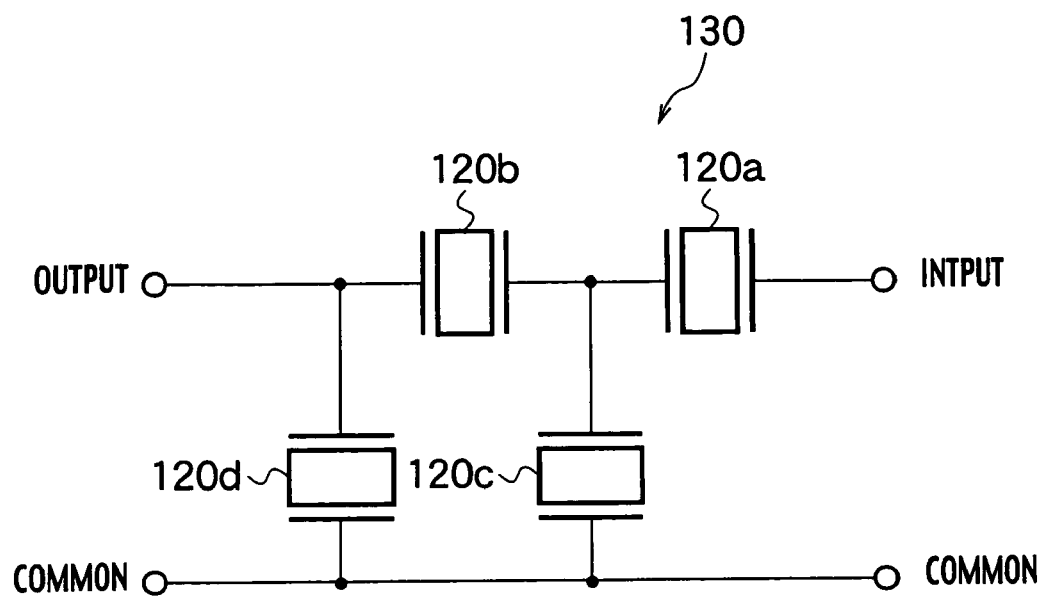
FIG. 54 is a block diagram showing an example of connection of an FBAR used in a variable frequency filter according to an application example of the first embodiment of the present invention.

For instance, as shown in FIG. 54, the FBARs 120a, 120b are connected in series from an input side to an output side. The FBARs 120c, 120d are connected in parallel to a common wiring, respectively, from output sides of FBARs 120a, 120b in series.

Figure 55:
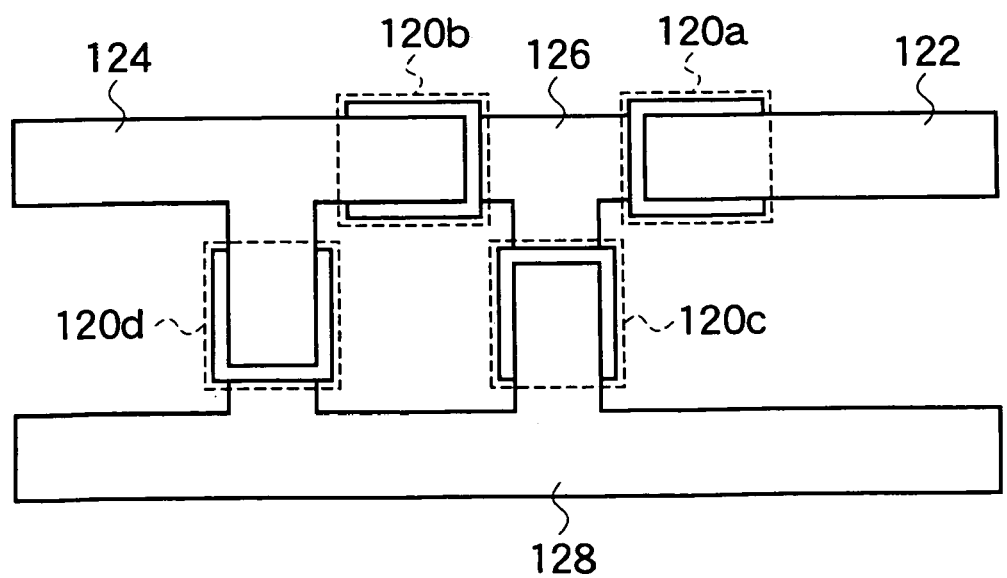
FIG. 55 is a view showing an example of disposal of an FBAR used in a variable frequency filter according to an application example of the first embodiment of the present invention.

For instance, as shown in FIG. 55, the FBAR 120a connected to an input wiring 122 is connected in series to the FBAR 120b connected to an output wiring 124 via a connecting wiring 126. The FBAR 120c connected to the connection wiring 126 is connected to a common wiring 128. The FBAR 120d connected to the output wiring 124 is connected to the common wiring 128.

As shown in FIG. 52, when an oscillation frequency of the VCO 141 is larger or smaller than a desired frequency, the PLL circuit detects a frequency difference between the oscillation frequency and the desired frequency, to feed back a direct-current (DC) control voltage Vctrl corresponding to the frequency difference to the variable capacitors C1 in the frequency variable filter 130. Therefore, the feedback loop normally works to reach a stable state and to lock a phase of the oscillation frequency. When locking the phase, the oscillation frequency of the VCO 141 may correspond with the desired frequency.

The PLL circuit uses a frequency variable filter 130a identical to the frequency variable filter 130 of VCO 141 as a band-pass filter for filtering a communication signal. For example, an input RF signal is transmitted to LNA 146. An amplified signal in LNA 146 is sent to the frequency variable filter 130a. A filtered RF signal in the frequency variable filter 130a is sent to an input terminal of the down-conversion mixer 147.

On the other hand, a reference signal generated in the VCO 141 is transmitted as a local oscillation (LO) signal to another input terminal of the mixer 147. The mixer 147 produces a difference between the RF signal and the LO signal, so as to down-convert the RF signal to a base band signal in intermediate frequency (IF).

In the application of the first embodiment, the same DC control voltage Vctrl generated by the loop filter 145 is added to both the frequency variable filter 130a and the frequency variable filter 130 in the VOC 141. As a result, it is possible for the oscillation frequency of the VCO 141 to correspond with the central frequency of the passing band of the frequency variable filter 130a.

Second Embodiment

Figure 56:
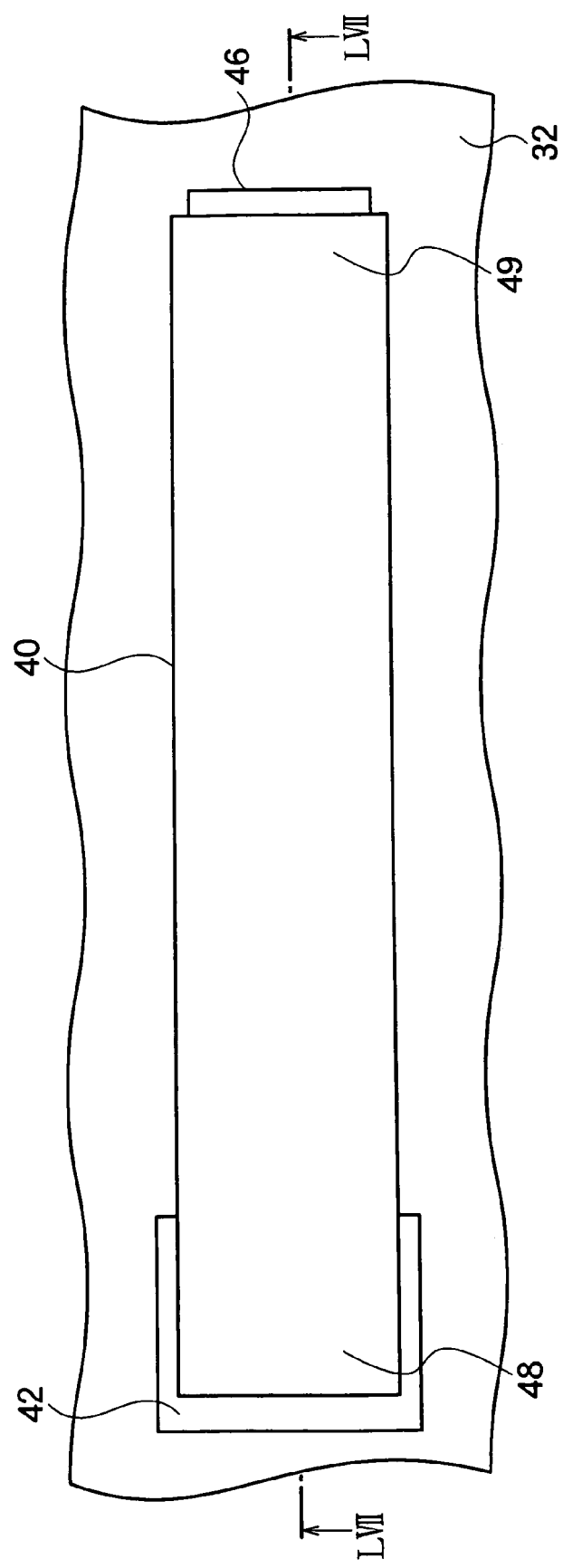
FIG. 56 is a plan view showing an example of a variable capacitor according to a second embodiment of the present invention.
Figure 57:
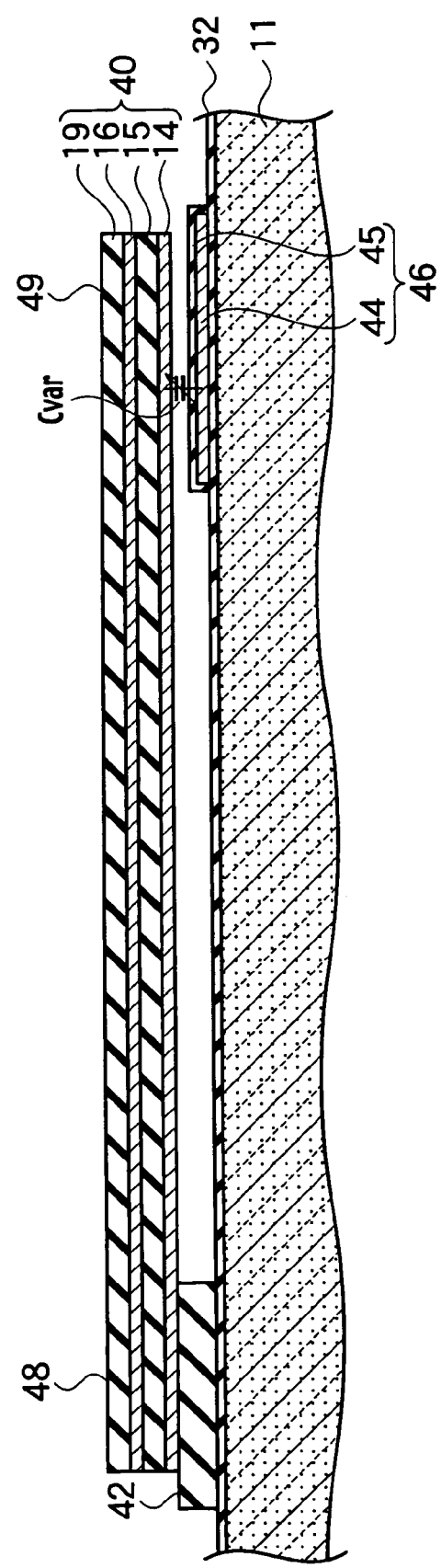
FIG. 57 is a cross section view taken on line LVII-LVII of the variable capacitor shown in FIG. 56.

A variable capacitor as a piezoelectric thin film device according to a second embodiment of the present invention includes a piezoelectric actuator 40 and a fixed electrode 46, as shown in FIG. 56. As shown in FIG. 57, a fixed end portion (first end portion) 48 of the piezoelectric actuator 40 is held on an anchor 42 provided on a surface of an insulating film 32 on a substrate 11. A working end portion (second end portion) 49 of the piezoelectric actuator 40 is projecting into a free space so as to face the fixed electrode 46 placed on the surface of the insulating film 32.

The piezoelectric actuator 40 includes a bottom electrode 14, a piezoelectric film 15, a top electrode 16, and a supporting film. The bottom electrode 14 is provided to extend to a location above the fixed electrode 46 from a surface of the anchor 42. The piezoelectric film 15 is placed on a surface of the bottom electrode 14. The top electrode 16 faces the bottom electrode 14 to sandwich the piezoelectric film 15 with the bottom electrode 14. The supporting film 19 is placed on a surface of the top electrode 16. The fixed electrode 46 includes a dielectric film 45 and a conductor film 44 covered by the dielectric film 45.

For the anchor 42, the supporting film 19 and the dielectric film 45, an insulator such as $Si_3N_4$ or $SiO_2$ is used. For the bottom electrode 14, an amorphous metal such as AlTa is used. For the piezoelectric film 15, a piezoelectric material such as AlN or ZnO is used. Additionally, for the top electrode 16 and the conductor film 44, a metal such as Al, Au, Pt, Cu, Ir, W, and Mo, which has a low resistance and can be easily processed, is desirably used.

The piezoelectric actuator 40 of the variable capacitor according to the second embodiment differs from the structure of the FBAR according to the first embodiment in that the piezoelectric actuator includes the supporting film 19 on the top electrode 16. The structures of the bottom electrode 14, the piezoelectric film 15, and the top electrode 16 are the same as the first embodiment, so duplicated descriptions are omitted.

The variable capacitor according to the second embodiment uses tunable capacitance Cvar between the conductor film 44 and the working end portion 49 of the bottom electrode 14. The capacitance Cvar varies depending on a change between the fixed electrode 46 and the bottom electrode 24 that is a movable electrode. When applying a voltage between the bottom electrode 14 and the top electrode 16 of the piezoelectric actuator 40, the piezoelectric film 15 distorts to expand or to contract due to the piezoelectric effect. The supporting film 19 provided on the top electrode 16 does not exhibit the piezoelectric effect. Thus, by expansion or contraction of the piezoelectric film 15, the piezoelectric actuator 40 is displaced in the direction perpendicular to the surface of the substrate 11. For instance, by expansion of the piezoelectric film 15 caused by tensile stress with applied voltage, the piezoelectric actuator 40 bends in the direction away from the surface of the substrate 11. On the other hand, by contraction of the piezoelectric film 15 caused by compression stress, the piezoelectric actuator 40 bends toward the surface of the substrate 11.

A movable range of the piezoelectric actuator 40 depends on the electromechanical coupling constant of the piezoelectric film 15. In the piezoelectric actuator 40, when the electromechanical coupling constant is large, the working end portion 49 can have a large displacement with a low driving voltage.

In the piezoelectric actuator 40 according to the second embodiment, since the piezoelectric film 15 is provided on the surface of the bottom electrode 14 of the amorphous metal film, the piezoelectric film 15 is highly oriented in the c-axis direction, which is a polarization direction. As a result, the electromechanical coupling constant increases to extend a movable range of the piezoelectric actuator 40. Therefore, a variable capacitance range of the variable capacitor using the piezoelectric actuator 40 may increase.

Next, a manufacturing method of a variable capacitor according to the second embodiment will be described with reference to the cross section views as shown in FIGS. 58 to 61.

Figure 58:
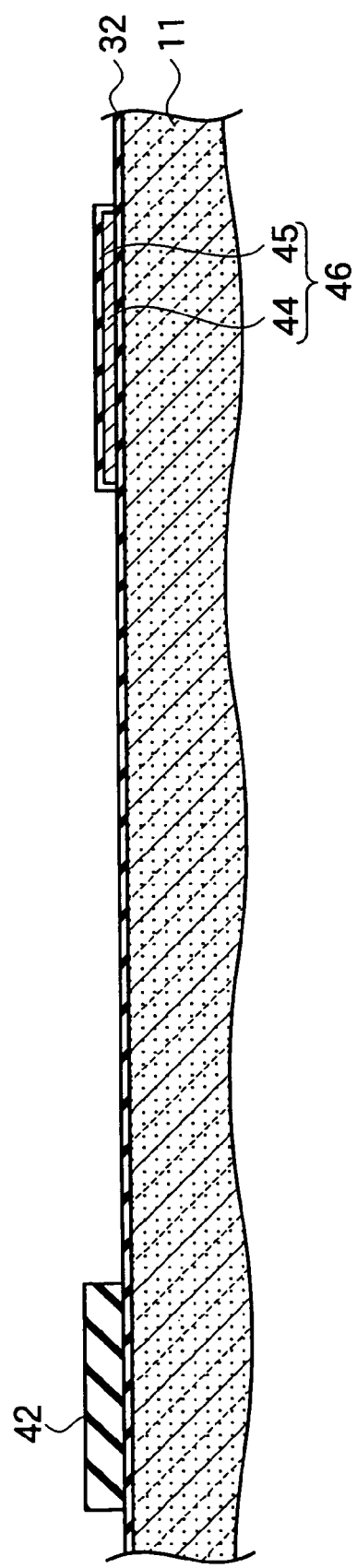
FIGS. 58 to 61 are cross section views showing an example of a manufacturing method of the variable capacitor according to the second embodiment of the present invention.

As shown in FIG. 58, an insulating film 32 such as $SiO_2$ is formed on a surface of a substrate 11 by thermal oxidation or the like. An insulator layer such as $Si_3N_4$ is deposited on a surface of the insulating film 32 by CVD and the like. The insulator layer is selectively removed by photolithography, etching using an $NH_4F$ solution, and the like to form an anchor 42.

A metal layer such as Al is deposited on the surface of the insulating film 32 by sputtering and the like. The Al metal film is selectively removed by photolithography, etching and the like to form a conductor film 44. A dielectric layer such as $Si_3N_4$ is deposited on the insulating film 32. The dielectric layer is selectively removed by photolithography, etching and the like to form a dielectric film 45 covering the conductor film 44. Thus, a fixed electrode 46 is formed.

Figure 59:
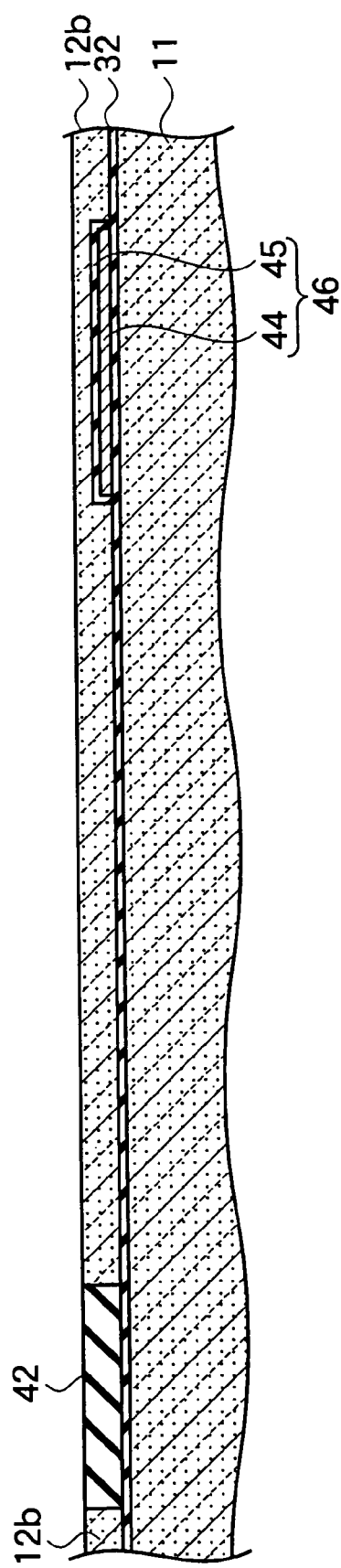
Figure 60:
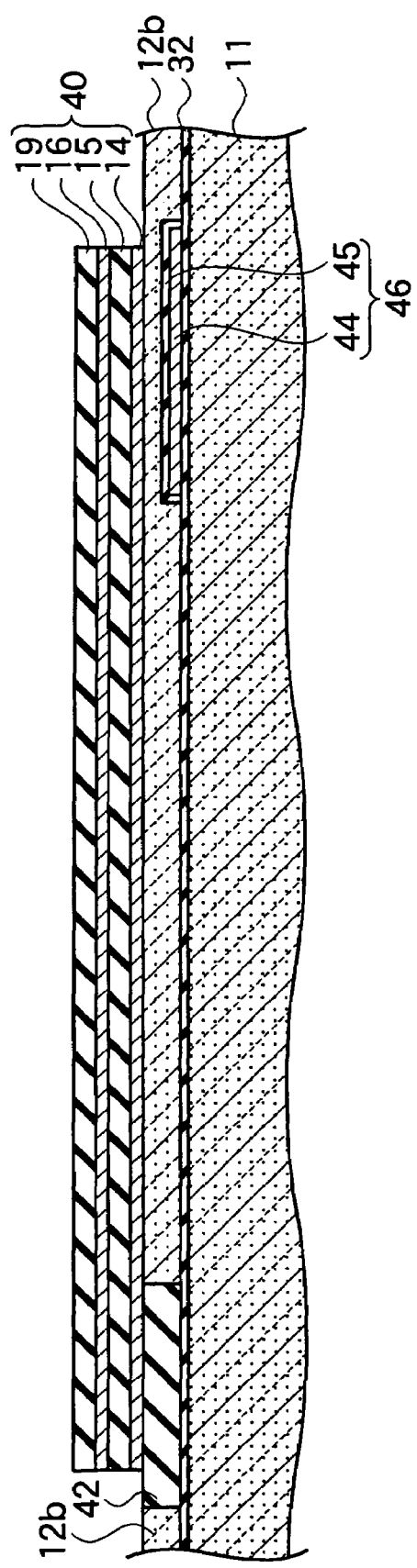

As shown in FIG. 59, a sacrificial layer 12b such as poly-Si is deposited by conformal CVD and the like on the surface of the insulating film 32 having the anchor 42 and the fixed electrode 46. The sacrificial layer 12b is planarized by CMP and the like, so that the surface of the anchor 42 is exposed. An amorphous metal layer such as $Al_{0.4}Ta_{0.6}$, a piezoelectric layer such as AlN, a metal layer such as Al and an insulator layer such as $SiO_2$ is deposited by magnetron sputtering and the like on the surface of the sacrificial layer 12b. As shown in FIG. 60, the insulator layer, the metal layer, the piezoelectric layer and the amorphous metal layer are selectively removed by photolithography, RIE and the like to form the piezoelectric actuator 40 having the bottom electrode 14, the piezoelectric film 15, the top electrode 16 and the supporting film 19.

Figure 61:
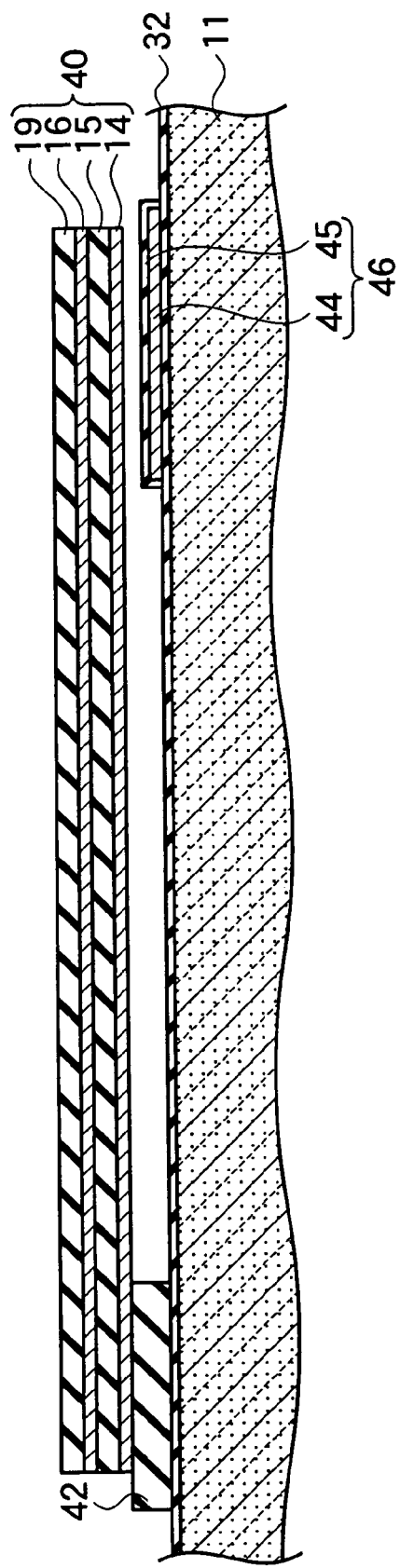

As shown in FIG. 61, the sacrificial layer 12b is selectively removed by dry etching using xenon fluoride ($XeF_2$) and the like. Thus, a variable capacitor which has the piezoelectric actuator 40 held on the anchor 42 and extending to a location above the fixed electrode 46, is manufactured.

In the second embodiment, the bottom electrode 14 of the even amorphous metal film is deposited on the surface of the sacrificial layer 12b planarized to a level of the surface of the anchor 42. On the even surface of the amorphous metal film, the piezoelectric film 15 can be highly oriented in the c-axis direction. The deposited piezoelectric film 15 is evaluated by XRD to determine the orientation FWHM. The measurement results show that the piezoelectric film 15 has an orientation FWHM of about 2.1°. Thus, it is determined that the piezoelectric film 15 is highly oriented in the c-axis direction.

Variable characteristics for capacitance of the manufactured variable capacitor are measured. For example, a tuning voltage of the piezoelectric actuator 40 is applied between the bottom and top electrodes 14, 16 in a range from 0 V to 3 V. Capacitance between the fixed electrode 46 and the bottom electrode 14 varies from the minimum of 0.34 pF to the maximum of 51 pF. A capacitance ratio of the maximum to the minimum is about 150. Thus, a large variable capacitance range is achieved.

According to the second embodiment, it is possible to highly orient the piezoelectric film 15 in the c-axis direction without using an expensive and complicated deposition technology such as epitaxial growth. Thus, it is possible to achieve a variable capacitor in which a variable capacitance range that can be increased by a low tuning voltage.

In addition, in the second embodiment, the piezoelectric actuator 40 is used in a variable capacitor which includes the fixed electrode 46 having the conductor film 44 covered with the dielectric film 45, as a piezoelectric thin film device. However, it may be possible to apply the piezoelectric actuator 40 to a micro switch which includes a fixed electrode having a conductor film alone.

Modification of the Second Embodiment

Figure 62:
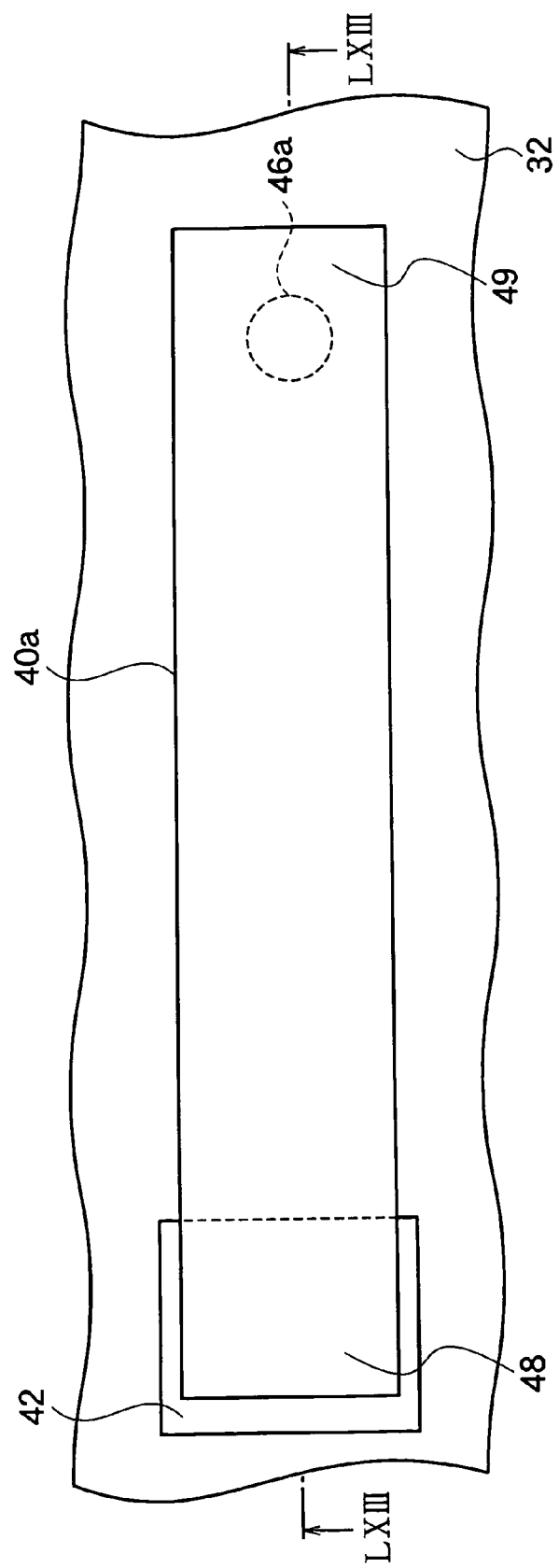
FIG. 62 is a plan view showing an example of a micro switch according to a modification of the second embodiment of the present invention.
Figure 63:
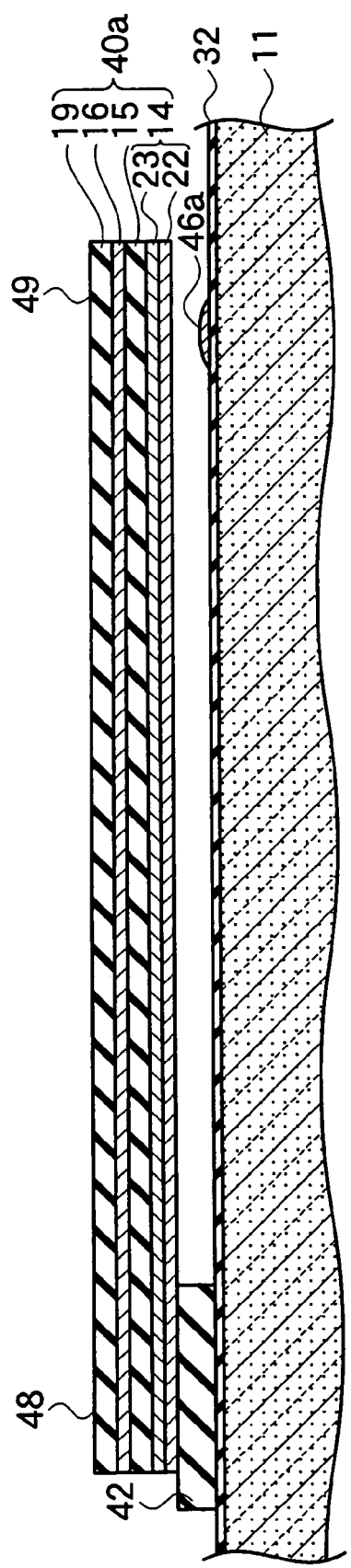
FIG. 63 is a cross section view taken on like LXIII-LXIII of the variable capacitor shown in FIG. 62.

A micro switch as a piezoelectric thin film device according to a modification of the second embodiment of the present invention includes a piezoelectric actuator 40a and a fixed electrode 46a, as shown in FIG. 62. As shown in FIG. 63, a fixed end portion 48 of the piezoelectric actuator 40a is held on an anchor 42 provided on a surface of an insulating film 32 on a substrate 11. A working end portion 49 of the piezoelectric actuator 40a is projecting into a free space so as to face the fixed electrode 46a placed on the surface of the insulation film 32.

The piezoelectric actuator 40a includes a bottom electrode 14, a piezoelectric film 15, a top electrode 16, and a supporting film. The bottom electrode 14 is provided to extend to a location above the fixed electrode 46a from a surface of the anchor 42. The piezoelectric film 15 is placed on a surface of the bottom electrode 14. The top electrode 16 faces the bottom electrode 14 to sandwich the piezoelectric film 15 with the bottom electrode 14. The supporting film 19 is placed on the top electrode 16. The bottom electrode 14 has an amorphous metal film 22 and an orientation metal film 23.

The amorphous metal film 22 of the bottom electrode 14 is an amorphous metal such as AlTa. The orientation metal film 23 is a metal which is easily oriented in the (111) orientation or in the (110) orientation direction, such as an fcc metal or a bcc metal. The fixed electrode 46a is a metal which has a low resistance and is easily processed, such as Al, Au, Pt, Cu, Ir, W, or Mo.

The piezoelectric actuator 40a of the micro switch according to the modification of the second embodiment differs from the second embodiment in that the bottom electrode 14 includes the amorphous metal film 22 and the orientation metal film 23. Other configurations are as in the second embodiment, so duplicated descriptions are omitted.

When applying a voltage between the bottom electrode 14 and the top electrode 16 of the piezoelectric actuator 40a, the piezoelectric film 15 distorts to expand or to contract due to the piezoelectric effect. For example, by contraction of the piezoelectric film 15 caused by compressive stress of an applied voltage, the piezoelectric actuator 40a bends toward the surface of the substrate 11. The bottom electrode 14 of the piezoelectric actuator 40a comes into contact with the fixed electrode 46a to switch the micro switch into a conducting state.

A movable range of the piezoelectric actuator 40a depends on the electromechanical coupling constant of the piezoelectric film 15. When the electromechanical coupling constant is large, the working end portion 49 can be greatly displaced by a low driving voltage in the piezoelectric actuator 40a.

In the piezoelectric actuator 40a according to the modification of the second embodiment, since the piezoelectric film 15 is provided on the surface of the orientation metal film 23 which is highly aligned in the (111) orientation or in the (110) orientation direction on the amorphous metal film 22, the piezoelectric film 15 is highly oriented in the c-axis direction, which is the polarization direction. As a result, the electromechanical coupling constant increases to expand a movable range of the piezoelectric actuator 40a. Therefore, it is possible to drive the micro switch having the piezoelectric actuator 40a at a low control voltage.

Next, a manufacturing method of a micro switch according to the modification of the second embodiment will be described with reference to the cross section views as shown in FIGS. 64 to 67.

Figure 64:
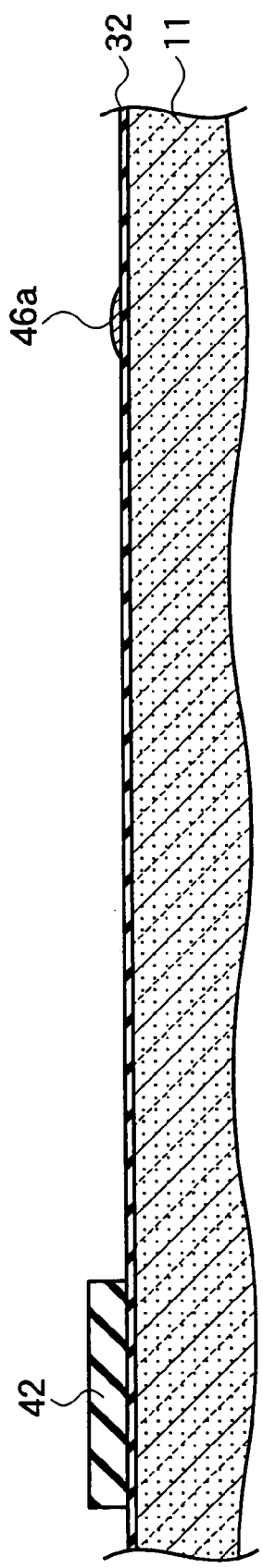
FIGS. 64 to 67 are cross section views showing an example of the micro switch according to the second embodiment of the present invention.

As shown in FIG. 64, an insulating film 32 such as $SiO_2$ is formed on a surface of a substrate 11 by thermal oxidation or the like. An insulator layer such as $Si_3N_4$ is deposited on a surface of the insulating film 32 by CVD and the like. The insulator layer is selectively removed by photolithography, etching using an $NH_4F$ solution, and the like to form an anchor 42. Additionally, by sputtering, lift-off processing, and the like, a metal film such as Au deposited on the surface of the insulating film 32 is selectively removed to form a fixed electrode 46a.

Figure 65:
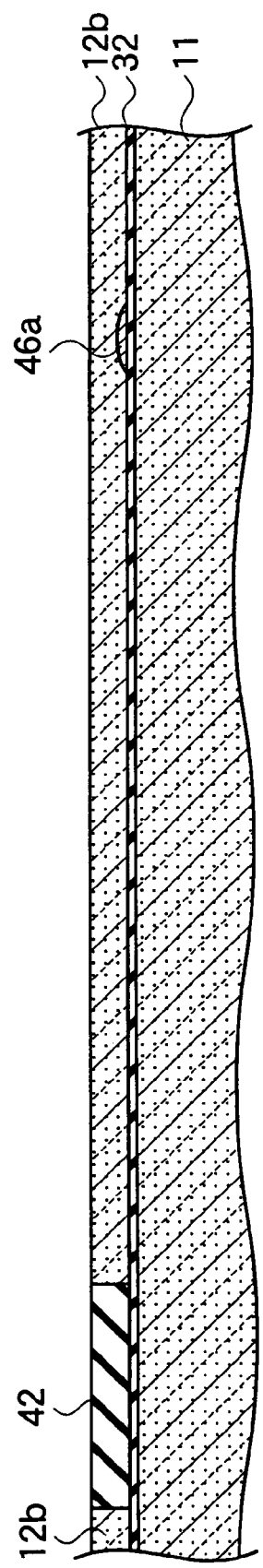

As shown in FIG. 65, a sacrificial layer 12b such as poly-Si is deposited on the surface of the insulating film 32 including the anchor 42 and the fixed electrode 46a by conformal CVD and the like. The sacrificial layer 12b is planarized by CMP and the like, so that the surface of the anchor 42 is exposed.

Figure 66:
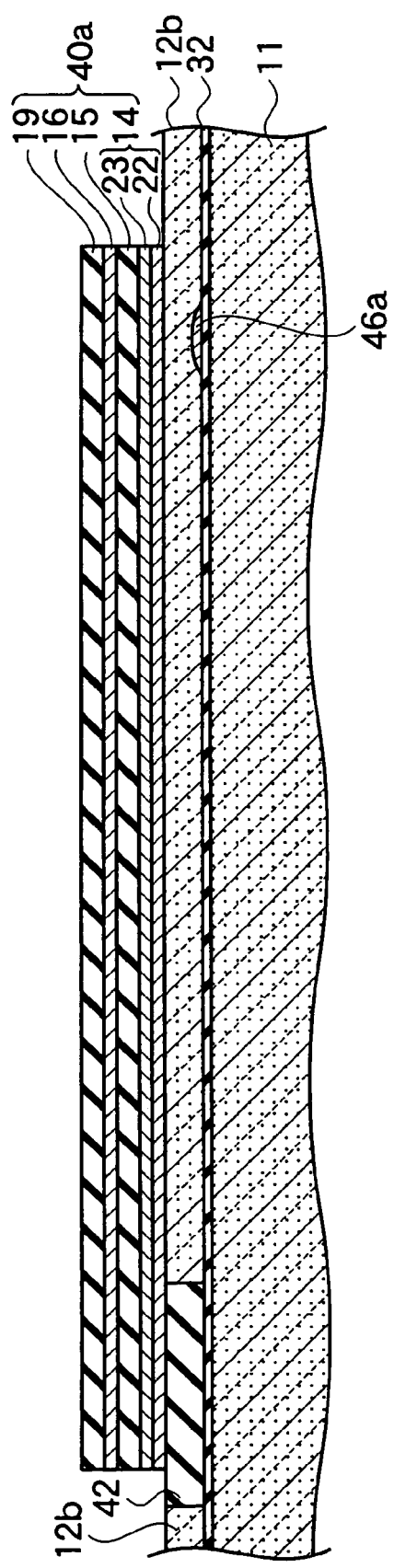

An amorphous metal layer such as $Al_{0.4}Ta_{0.6}$, a bottom metal layer such as Al, a piezoelectric layer such as AlN, a top metal layer such as Al, and an insulator layer such as $SiO_2$ are deposited on a surface of the sacrificial layer 12b by magnetron sputtering and the like. As shown in FIG. 66, the insulator layer, the top metal layer, the piezoelectric layer, the bottom metal layer and the amorphous metal layer are selectively removed by photolithography, RIE and the like to form the piezoelectric actuator 40a having a bottom electrode 14, a piezoelectric film 15, a top electrode 16, and a supporting film 19. The bottom electrode 14 includes an amorphous metal layer 22 and an orientation metal layer 23.

Figure 67:
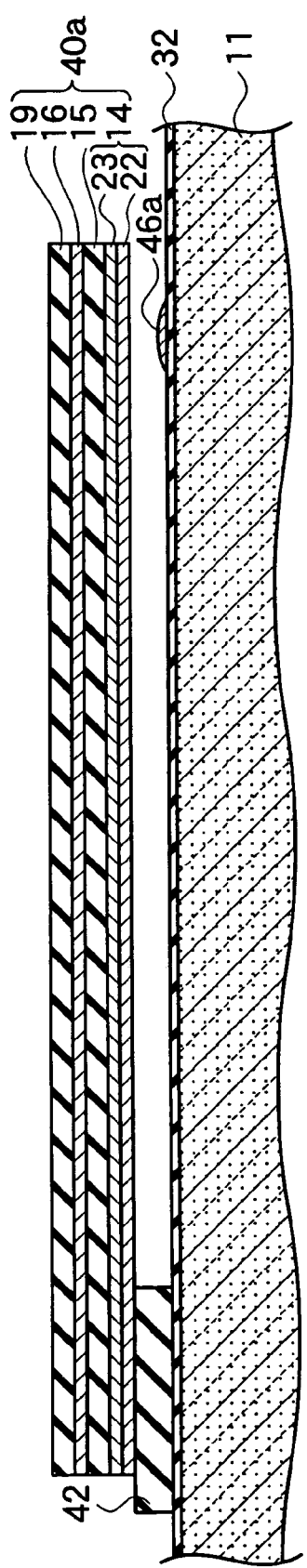

As shown in FIG. 67, the sacrificial layer 12b is selectively removed by dry etching using $XeF_2$, and the like. Thus, a micro switch which includes the piezoelectric actuator 40a held on the anchor 42 and extending to a location above the fixed electrode 46a, is manufactured.

In the modification of the second embodiment, the even amorphous metal film is deposited on the surface of the sacrificial layer 12b planarized to a level of the surface of the anchor 42. On the even surface of the amorphous metal layer 22, the orientation metal film 23 can be deposited to be highly oriented in the (111) orientation direction. As a result, the piezoelectric film 15 can be highly oriented in the c axis direction. The deposited piezoelectric film 15 is evaluated by XRD to determine the orientation FWHM. The measurement results show that the piezoelectric film 15 has an orientation FWHM of about 2.4°. Thus, it is determined that the piezoelectric film 15 is highly oriented in the c-axis direction.

Electrical characteristics of the manufactured micro switch are measured. For example, a control voltage of the piezoelectric actuator 40a is applied between the top and bottom electrodes 14, 16 to evaluate an insulation resistance and "ON" resistance at a frequency of 2 GHz. At a control voltage of 0 V, the insulation resistance between the fixed electrode 46a and the bottom electrode 14 is about 28 dB. At a control voltage of 3 V, the "ON" resistance between the fixed electrode 46a and the bottom electrode 14 is about 0.3 dB. Thus, in a micro switch according to the modification of the second embodiment, low control voltage driving, a small "ON" resistance, and a high insulation resistance may be achieved in a high frequency region.

According to the modification of the second embodiments, it is possible to highly orient the piezoelectric film 15 in the c-axis direction without using an expensive and complicated deposition technology such as epitaxial growth. Thus, it is possible to achieve a micro switch having improved high-frequency characteristics and driven by a low control voltage.

In the modification of the second embodiment, the piezoelectric actuator 40a is used in a micro switch having a metal film as the fixed electrode 46a. However, it may be possible to apply the piezoelectric actuator 40a to a variable capacitor having a fixed electrode in which a conductor film is covered by a dielectric film as shown in FIG. 57.

Other Embodiments

The present invention has been described as mentioned above. However the descriptions and drawings that constitute a portion of this disclosure should not be perceived as limiting this invention. Various alternative embodiments and operational techniques will become clear to persons skilled in the art from this disclosure.

What is claimed is:

1. A piezoelectric thin film device, comprising:
   an amorphous metal film disposed above a substrate; and
   a piezoelectric film disposed above the amorphous metal, wherein
   a crystal axis of the piezoelectric film is aligned in a direction perpendicular to a surface of the amorphous metal.

2. The piezoelectric thin film device of claim 1, wherein the piezoelectric film is disposed on the surface of the amorphous metal.

3. The piezoelectric thin film device of claim 1, further comprising:
   an orientation metal film disposed between the amorphous metal film and the piezoelectric film, wherein
   a crystal axis of the orientation metal film is aligned in the direction perpendicular to the surface of the amorphous metal.

4. The piezoelectric thin film device of claim 3, wherein the orientation metal film is one of a face-centered cubic lattice metal and a body-centered cubic lattice metal.

5. The piezoelectric thin film device of claim 3, further comprising a low resistance metal film facing the orientation metal film to sandwich the amorphous metal film with the orientation metal film.

6. The piezoelectric thin film device of claim 5, wherein the low resistance metal film has a resistivity in a range from about $1 \times 10^{-8} \Omega m$ to about $10 \times 10^{-8} \Omega m$.

7. The piezoelectric thin film device of claim 1, further comprising a top metal film disposed on a surface of the piezoelectric film.

8. The piezoelectric thin film device of claim 4, wherein a region defined as a facing area of the amorphous metal film and the top metal film, and a section of the piezoelectric film sandwiched between the amorphous metal film and the top metal film is projecting into a free space.

9. The piezoelectric thin film device of claim 4, wherein a first end portion of the amorphous metal film is supported by the substrate, and a second end portion of the amorphous metal film is projecting into a free space.

10. The piezoelectric thin film device of claim 9, wherein the second end portion faces a fixed electrode placed on a surface of the substrate.

11. The piezoelectric thin film device of claim 1, wherein the amorphous metal film is aluminum tantalum alloy.

12. The piezoelectric thin film device of claim 1, wherein the piezoelectric film is one of aluminum nitride and zinc oxide.

13. The piezoelectric thin film device of claim 1, wherein the amorphous metal has a thickness in a range from about 5 nm to 200 nm.

14. The piezoelectric thin film device of claim 1, wherein a root mean square roughness of the amorphous metal is about 3 nm and below.

15. The piezoelectric thin film device of claim 1, wherein an orientation of said crystal axis of the piezoelectric film has a full width at half maximum less than about 3°.

* * * * *